(12) United States Patent
Ozasa et al.

(10) Patent No.: US 7,463,278 B2
(45) Date of Patent: Dec. 9, 2008

(54) PIXEL CLOCK GENERATION CIRCUIT

(75) Inventors: Dan Ozasa, Kanagawa (JP); Masaaki Ishida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 117 days.

(21) Appl. No.: 11/102,860

(22) Filed: Apr. 11, 2005

(65) Prior Publication Data

US 2005/0243163 A1 Nov. 3, 2005

(30) Foreign Application Priority Data

Apr. 12, 2004 (JP) ............................. 2004-117200

(51) Int. Cl.
*B41J 2/435* (2006.01)

(52) U.S. Cl. ...................................... 347/249
(58) Field of Classification Search ................ 347/237, 347/247, 234, 235, 248–250
See application file for complete search history.

(56) References Cited

U.S. PATENT DOCUMENTS

| 6,731,317 | B2 * | 5/2004 | Ema et al. ............... 347/135 |
| 6,927,789 | B2 * | 8/2005 | Ozasa et al. ............. 347/249 |
| 7,103,855 | B2 * | 9/2006 | Saeki ...................... 716/1 |
| 2003/0156184 | A1 * | 8/2003 | Suzuki et al. .......... 347/249 |
| 2004/0263227 | A1 * | 12/2004 | Baker et al. ............ 327/158 |
| 2005/0243163 | A1 | 11/2005 | Ozasa et al. |

FOREIGN PATENT DOCUMENTS

| JP | 11-167081 | 6/1999 |
| JP | 2001-228415 | 8/2001 |
| JP | 2001-290469 | 10/2001 |
| JP | 2003-98465 | 4/2003 |
| JP | 2003-103831 | 4/2003 |
| JP | 3512397 | 1/2004 |

OTHER PUBLICATIONS

U.S. Appl. No. 11/494,528, filed Jul. 28, 2006, Nihei, et al.
U.S. Appl. No. 10/953,372, filed Sep. 30, 2004, Yasuhiro Nihei, et al.
U.S. Appl. No. 12/055,666, filed Mar. 26, 2008, Tanabe, et al.
U.S. Appl. No. 12/029,115, filed Feb. 11, 2008, Omori, et al.

* cited by examiner

*Primary Examiner*—Hai C Pham
(74) *Attorney, Agent, or Firm*—Oblon, Spivak, McClelland, Maier & Neustadt, P.C.

(57) ABSTRACT

A pixel clock generation circuit is disclosed, including a high frequency clock generation unit configured to generate high frequency clock, a clock modulation data generation unit configured to generate clock modulation data based on pixel clock phase data indicating timing of a transition in pixel clock. The pixel clock generation circuit further includes a modulation clock generation unit configured to modulate the frequency and phase of the high frequency clock based on the modulation data thereby to generate modulated pixel clock.

17 Claims, 34 Drawing Sheets

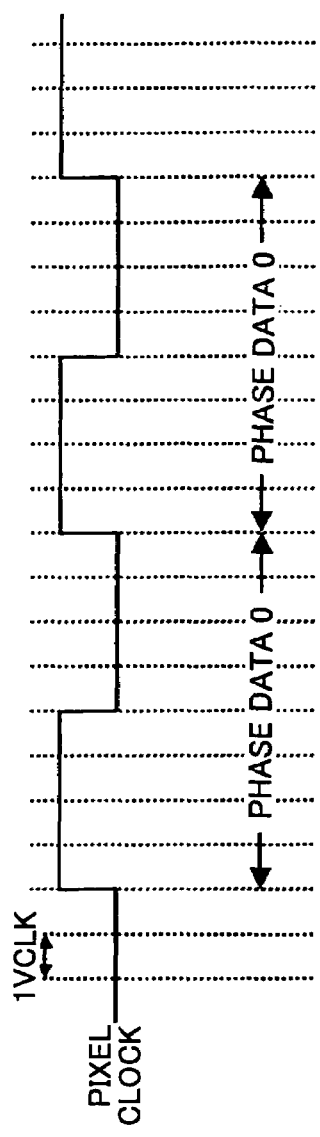
FIG.2A  PHASE DATA 0
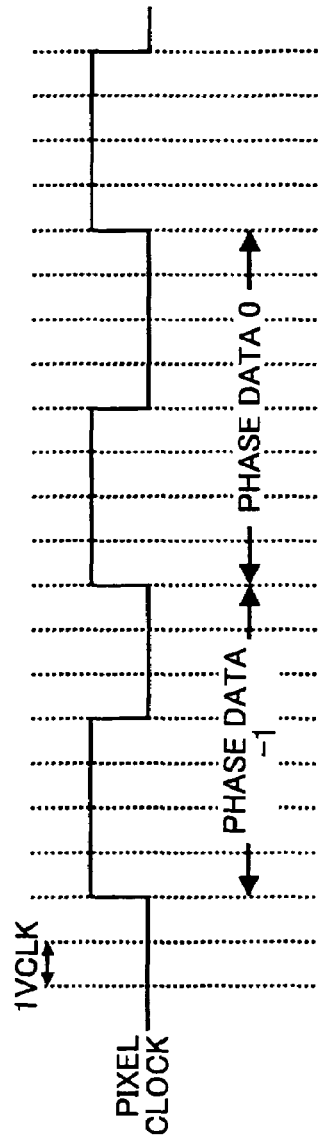
FIG.2B  PHASE DATA −1
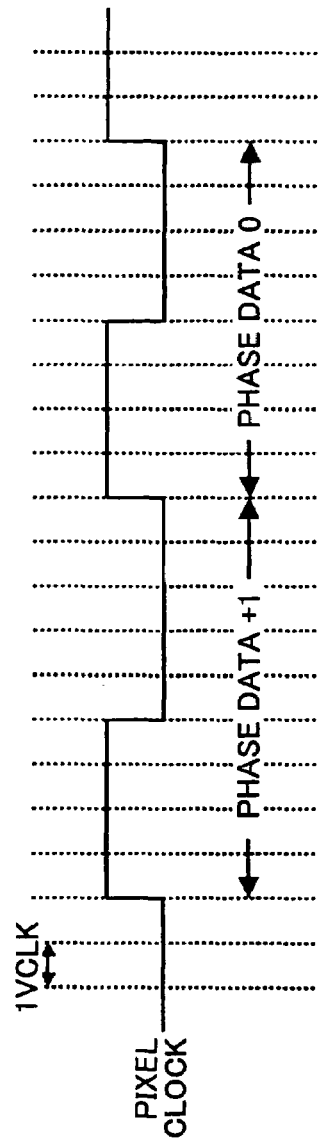
FIG.2C  PHASE DATA +1

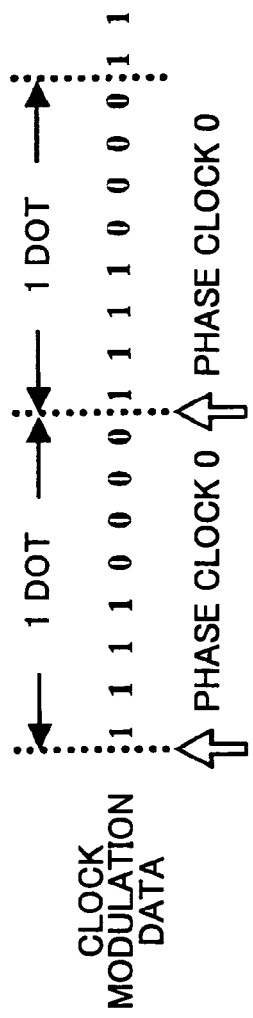
FIG.3A PHASE DATA 0
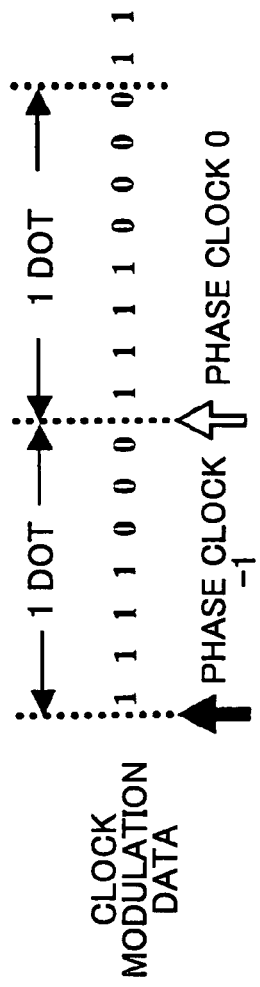
FIG.3B PHASE DATA −1
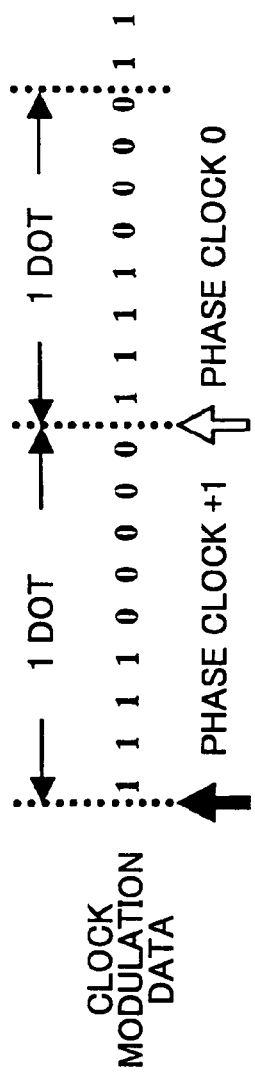
FIG.3C PHASE DATA +1

FO2　FO4　　FO3　FO1

FO1
FO2
FO3
FO4

PIXEL CLOCK GENERATION CIRCUIT

BACKGROUND OF THE INVENTION

1. Field of the Invention

The present invention generally relates to the generation of pixel clock and phase control thereof used for image forming apparatuses, and particularly, to a pixel clock generation circuit that realizes highly accurate phase control of the pixel clock and a image forming apparatus using the same.

2. Description of the Related Art

The general construction of an image forming apparatus such as a laser printer and a digital copier is shown in FIG. 40. As shown in FIG. 40, a laser beam emitted by a semiconductor laser unit 4001 is scanned by a rotating polygon mirror 4002, converges into a light spot on a photosensitive unit 4004 via a scan lens 4003, and exposes the photosensitive unit 4004 thereby to form a electrostatic latent image. Each scanned laser beam is detected by a photo detector 4005. A clock generation circuit 4008 provides clock to a phase sync circuit 4009, and the phase sync circuit 4009 generates image clock (pixel clock) in synchronization with the output signal from the photo detector 4005. The image clock is fed to a image processing unit 4006 and a laser drive circuit 4007. According to the above arrangements, the semiconductor laser unit 4001 controls a time interval in which the semiconductor laser emits a laser beam in accordance with image data generated by the image processing unit 4006 and image clock the phase of which is set by the phase sync circuit 4009 line by line thereby to control electrostatic latent image formed on the photosensitive unit 4004.

In such an scanning optical system, the speed at which a light spot scans the surface of the photosensitive unit 4004 may vary in dependence on the distance of a reflective surface of a deflection unit such as a polygon scanner from the rotative axis thereof. This change in scanning speed may cause the fluctuation of images, and results in the degradation of image quality. The scanning speed needs to be adjusted for improving image quality.

In the case of a multi-beam optical system, the frequencies of light beams may be different. If the chromatic aberration of the multi-beam optical system is not adjusted, the difference in frequencies may cause the positions of formed electrostatic latent images. This means that the range on the surface of the photosensitive unit 4004 in which each light spot scans may differ from each other, and results in the degradation of image quality. Therefore, the scan range needs to be adjusted.

These adjustments are conventionally done by changing the frequency of pixel clock thereby to control the position of the light spot along a scan line. This technique is described in a reference documents 1 and 2 described below, for example. However, the adjustment of the pixel clock frequency generally requires a complex pixel clock control unit. The smaller the quantity of frequency needs to be changed, the more complex the pixel clock control unit becomes. As a result, the fine adjustment of pixel clock frequency is difficult.

To solve this problem, the applicant has proposed in a reference document 3 (described below) a pixel clock generation circuit that can adjust the phase of the pixel clock, and the structure thereof is relatively simple. This pixel clock generation circuit basically includes a high frequency clock generation unit and a pixel clock generation unit. The high frequency clock generation unit generates a high frequency clock. The pixel clock generation unit generates a pixel clock based on the high frequency clock output from the high frequency clock generation unit and phase data indicating the transition timing of the pixel clock, and change the cycle of the pixel clock. The pixel clock generation unit includes a counter unit that counts the high frequency clock, a comparator unit that compares the count of the counter unit with the phase data indicating the transition timing of the pixel clock, and a pixel clock control unit that causes the pixel clock to make a transition based on the result of comparison performed by the comparator unit. Therefore, the pixel clock generation circuit described above still remains relatively complex.

The above reference documents are the following Japanese Patent Laid-Open Patent Applications: (1) No. 11-167081, (2) No. 2001-228415, and (3) No. 2003-098465.

SUMMARY OF THE INVENTION

Accordingly, it is a general object of the present invention to provide a pixel clock generation circuit that can control the phase of the image clock and that has more simple structure, and to provide an image forming apparatus using the same.

Another and more specific object of the present invention is to provide a pixel clock generation circuit that is more simple, operates at high accuracy and high speed, and to provide an image forming apparatus using the same.

To achieve at least one of the above objects, a pixel clock generation circuit according to the present invention includes: a high frequency clock generation unit configured to generate high frequency clock; a clock modulation data generation unit configured to generate clock modulation data based on pixel clock phase data indicating timing of a transition in pixel clock; and a modulation clock generation unit configured to modulate the frequency and phase of the high frequency clock based on the modulation data thereby to generate modulated pixel clock.

According to an embodiment, the clock modulation data generation unit outputs, for example, clock modulation data including a plurality of bits that are consecutive 1's in-a first portion of the output clock modulation data and consecutive 0's in the remaining portion of the output clock modulation data, the number of the 1's and/or the number of 0's being variable, based on the pixel clock phase data; and a load signal for loading the clock modulation data. The modulation clock generation unit may comprise a shift register configured to load the clock modulation data in parallel based on the load signal, and to output the loaded clock modulation data serially by shifting based on the high frequency clock. The high frequency clock generation unit may comprise a PLL circuit or a DLL circuit. According to the above arrangements, the pixel clock generation circuit of simple structure can control the frequency and phase shift of the pixel clock, and generate a desired clock at a desired position in the scan range.

Other objects, features, and advantages of the present invention will become more apparent from the following detailed description when read in conjunction with the accompanying drawings.

BRIEF DESCRIPTION OF THE DRAWINGS

FIGS. 2A-2C illustrate the generation of modulated pixel clock according to the present invention;

FIGS. 3A-3C illustrate the correspondence between pixel clock phase data and clock modulation data;

DETAILED DESCRIPTION OF THE PREFERRED EMBODIMENTS

The preferred embodiments of the present invention are described in detail below with reference to the drawings.

Figure 1:
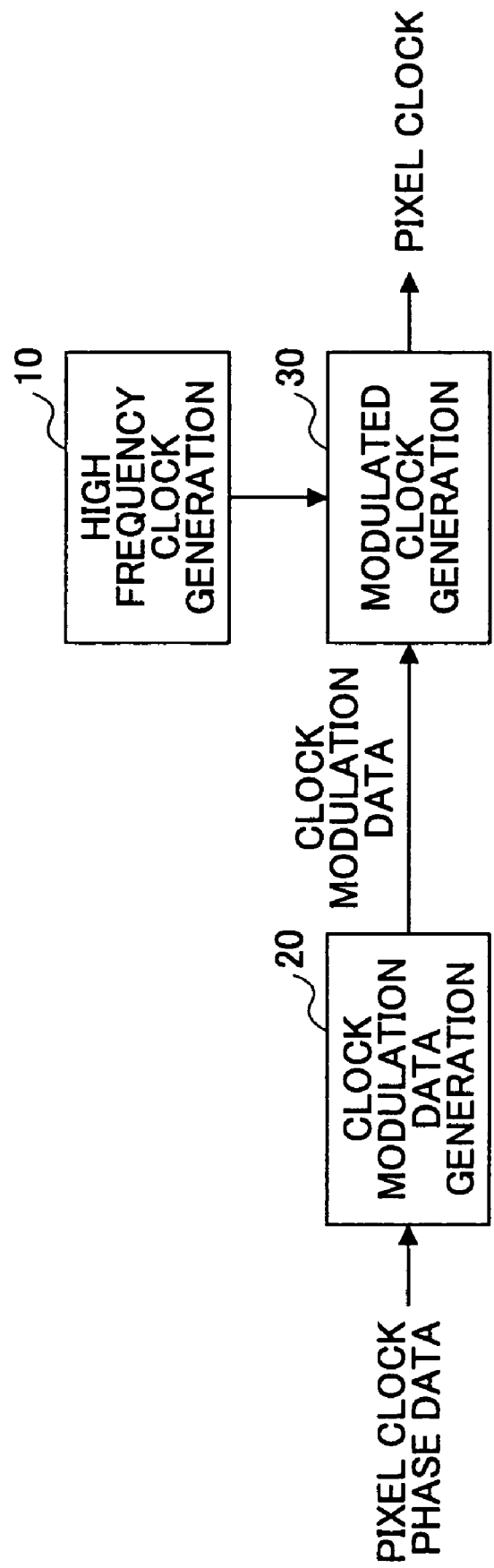
FIG. 1 illustrates the basic concept of a pixel clock generation circuit according to the present invention.

FIG. 1 illustrates the basic concept of a pixel clock generation circuit according to the present invention. In FIG. 1, a high frequency clock generation unit 10 generates high frequency clock VCLK the frequency is much more higher than that of the pixel clock corresponding to one dot. A clock (CLK) modulation data generation unit 20 generates clock modulation data including consecutive 1's and consecutive 0's, the number of which is variable, based on the pixel clock phase data indicating the timing in which the pixel clock make a transition. A modulation clock generation unit 30 receives (loads) the clock modulation data output by the clock modulation data generation unit 20, and shift the received clock modulation data based on the high frequency clock VCLK, thereby to output pixel clock (modulated pixel clock) the frequency and phase of which are modulated based on the pixel clock phase data. As will be appreciated below, the modulation clock generation unit 30 may include a shift register. According to the above arrangements, the pixel clock generation circuit can control the frequency and phase shift of the pixel clock at high accuracy by the VCLK.

The pixel clock phase data (phase data) is digital data of several bits, for example, that indicates the quantity of phase shift of the pixel clock for the adjustment of scan inequality due to the property of a scan lens, the adjustment of the deviation of dot position due to unequal rotation of a polygon mirror, and the adjustment of the deviation of dot position due to the chromatic aberration of laser beam. Detailed information of the pixel clock phase data is available in the above reference document 3 (Japanese Patent Laid-Open Application No. 2003-098465), the entire contents of which are hereby incorporated by reference.

FIGS. 2A-2C illustrate the generation of modulated pixel clock according to the present invention. In FIGS. 2A-2C, one basic cycle of the pixel clock is assumed to correspond to 8 cycles of the high frequency clock VCLK. FIG. 2A shows the case in which the phase data is "0", and pixel clock of the basic cycle is generated in which the phase of the pixel clock is not shifted at all. The pixel clock corresponding to the first 4 VCLK cycles among 8 is high (high), and the pixel clock corresponding to the remaining 4 VCLK cycles among 8 is low (off). FIG. 2B shows the case in which the phase data is "−1", and the pixel clock is configured with seven VCLK cycles, the first 4 VCLK cycles among 7 being high (on), and the remaining 3 VCLK cycles among 7 being low (off). The phase of the pixel clock is shifted forward by one VCLK cycle. FIG. 2C shows the case in which the phase data is "+1", and the pixel clock is configured with nine VCLK cycles, the first 4 VCLK cycles among 9 being high (on), and the remaining 5 VCLK cycles among 9 being low (off). The phase of the pixel clock is shifted backward by one VCLK cycle.

The number of VCLK cycles corresponding to one pixel clock, the number of high (on) VCLK clocks, and the number of low (off) VCLK clocks depends on the clock modulation data generated based on the pixel clock phase data (phase data). FIGS. 3A-3C illustrate the clock modulation data corresponding to the phase data of "0", "−1", or "+1". Black and white arrows shown in FIGS. 3A-3C indicate data load timing.

The operation of the pixel clock generation circuit according to the present invention shown in FIG. 1 is described with reference to FIGS. 2 and 3.

If the pixel clock phase data (phase data) is "0", the clock modulation data generation unit 20 outputs clock modulation data of 8 bits per one dot as shown in FIG. 3A. The modulation clock generation unit 30 is configured by a shift register, which loads the 8-bit clock modulation data in parallel at the timing indicated by the white arrow, and shifts the loaded clock modulation data serially using the high frequency clock VCLK. As a result, the modulated clock generation unit 30 outputs pixel clock the pixel clock of the basic cycle as shown in FIG. 2A.

If the phase data is "−1", the clock modulation data generation unit 20 outputs clock modulation data of 7 bits per one dot as shown in FIG. 3B. The modulation clock generation unit 30 loads the 7-bit clock modulation data in parallel at the timing indicated by the black arrow, and shifts the loaded clock modulation data serially using the high frequency clock VCLK. As a result, the modulated clock generation unit 30 outputs pixel clock the phase of which is shifted forward by one VCLK clock with respect to the basic cycle.

If the phase data is "+1", the clock modulation data generation unit 20 outputs clock modulation data of 9 bits per one dot as shown in FIG. 3C. The modulation clock generation unit 30 loads the 9-bit clock modulation data in parallel at the timing indicated by the black arrow, and shifts the loaded clock modulation data serially using the high frequency clock VCLK. As a result, the modulated clock generation unit 30 outputs pixel clock the phase of which is shifted backward by one VCLK clock with respect to the basic cycle.

According to the above arrangements, the pixel clock generation circuit according to the present invention can shift the phase of the next cycle of the pixel clock forward or backward by varying the number of consecutive 0's in the clock modulation data based on the value of the phase data. In the above example shown in FIGS. 2 and 3, the number of 1's in the clock modulation data is fixed to four, and only the number of 0's in the clock modulation data is varied from four thereby to shift the pixel clock forward or backward. However, according to another embodiment, the number of 1's may be varied and the number of 0's may be fixed. According to yet another embodiment, both the number of 1's and 0's may be varied.

Figure 4:
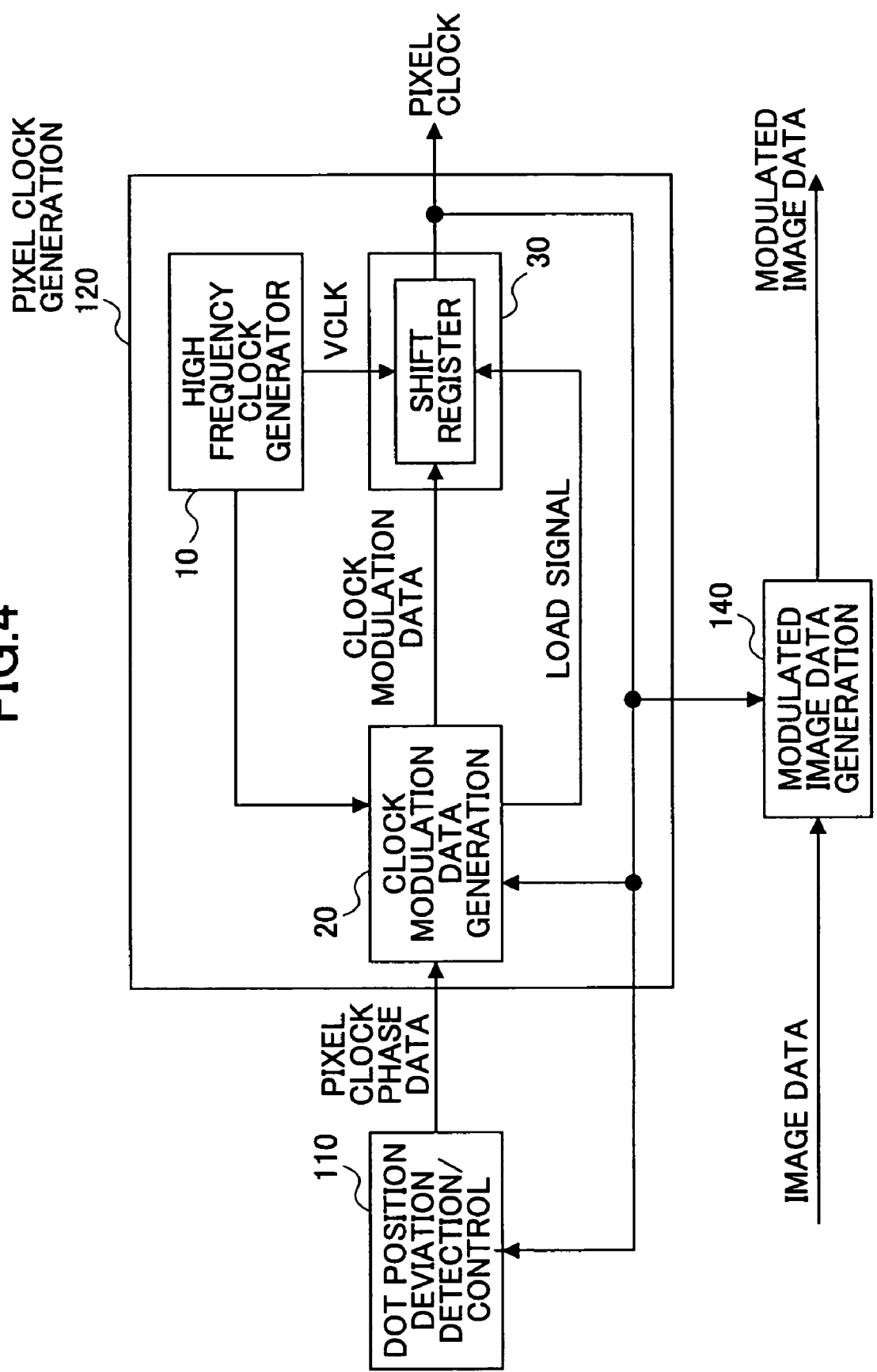
FIG. 4 illustrates the main structure of an image processing unit that includes the pixel clock generation circuit according to the present invention.

FIG. 4 illustrate an image processing unit in which the pixel clock generation circuit according to the present invention is provided. A dot position deviation detection/control unit 110 detects dot position deviation caused by scan inequality due to the properties of the scan lens and rotation inequality of the polygon mirror, generates the pixel clock phase data (phase data) for adjusting the deviation, and output the pixel clock phase data to the pixel clock generation unit 120. The dot position deviation detection/control unit 110 is further described below in more detail. The pixel clock generation unit 120 is the pixel clock generation circuit according to an embodiment of the present invention, and includes a high frequency clock generator unit 10, a clock modulation data generation unit 20, and a modulation clock generation unit 30 including a shift register. The clock modulation data generation unit 20 generates the clock modulation data (FIG. 3) and a load signal based on the pixel clock phase data. The modulation clock generation unit 30 loads the clock modulation data to the shift register in response to the load signal. The clock modulation data loaded is serially shifted in accordance with the high frequency clock output from the high frequency clock generation unit 10. The modulation clock generation unit 30 outputs pixel clock the frequency and phase of which are modulated as shown in FIG. 2. The dot position deviation detection/control unit 110 and the clock modulation data generation unit 20 generate the pixel clock phase data, the clock modulation data, and the load signal for each dot based on the pixel clock as a reference. On the other hand, a modulated image data generation unit 140 receives image data, and generates modulated image data (generally, pulse width modulation signal) in accordance with the pixel clock as a reference.

An example of the modulated image data generation unit 140 includes a pulse modulation signal generation circuit described in Japanese Patent Laid-Open Application No. 2003-103831, the entire contents of which is hereby incorporated by reference. If the pulse modulation signal generation circuit is used as the modulated image data generation unit 140, both the pixel clock generation unit 120 and the modulated image data generation unit 140 can share the same high frequency clock, and the circuit elements such as a shift register used for both units 120 and 140 are similar. As a result, the pixel clock generation unit 120 and the modulated image data generation unit 140 can be built as a one-chip application specific integrated circuit (ASIC).

A detailed description is given on the clock modulation data generation unit 20, the modulation clock generation unit 30, and the high frequency clock generation unit 10 included in the pixel clock generation unit 120.

Figure 5:
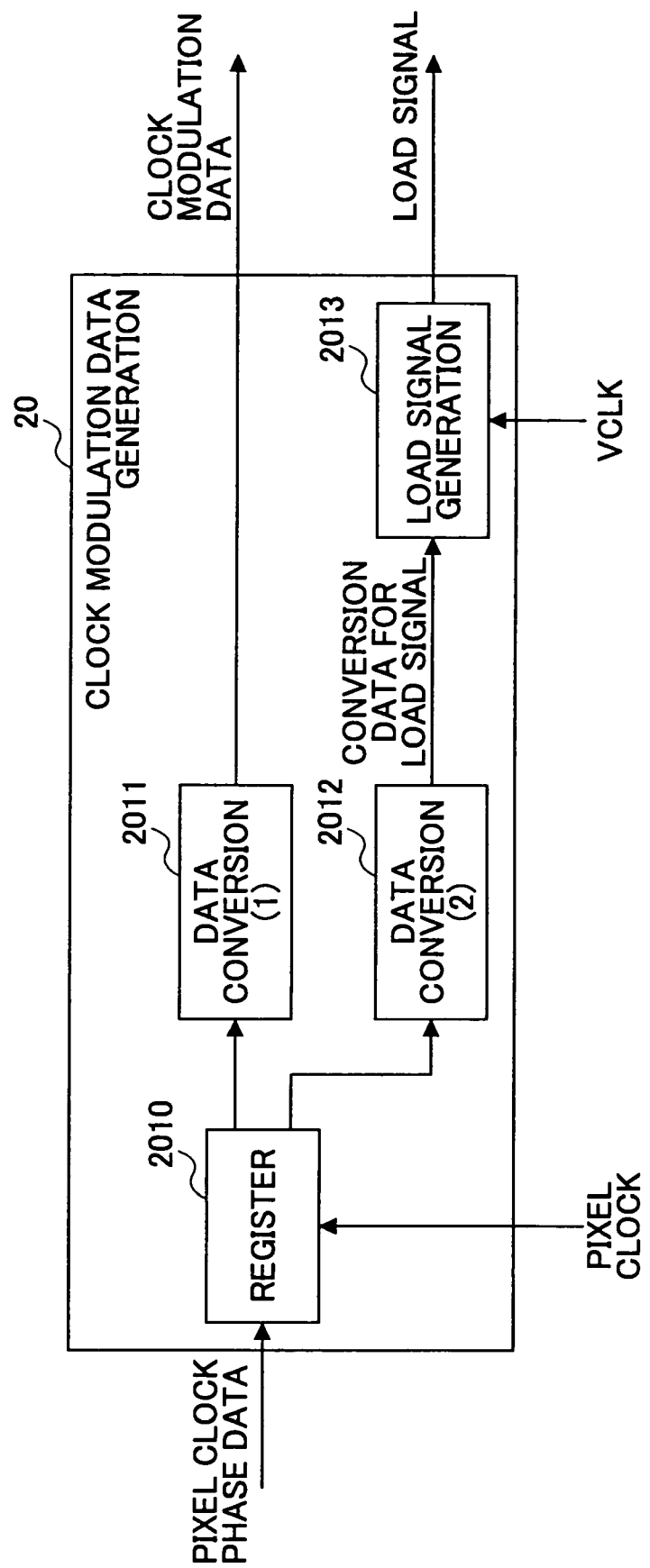
FIG. 5 illustrates the structure of a clock modulation data generation unit.

FIG. 5 illustrate an exemplary configuration of the clock modulation data generation unit 20 according to an embodiment. A register 2010 latches the pixel clock phase data based on the pixel clock, and outputs the latched pixel clock phase data to a data conversion unit (1) 2011 and a data conversion unit (2) 2012. The data conversion units 2011 and 2012 include memory such as lookup table, and output selective data in dependence on a input value. Particularly, the data conversion unit (1) 2011 receives the pixel clock phase data (phase data), and outputs the clock modulation data having a predetermined number of bits, including consecutive 1's in the first portion of the clock modulation data and consecutive 0's in the remaining portion of the clock modulation data. The conversion unit (2) 2012 receives the pixel clock phase data, and outputs conversion data for load signals to a load signal generation unit 2013. The conversion data for load signals indicates the timing in which the clock modulation data is loaded, that is, the timing in which the load signal is output. The load signal generation unit 2013 receives the high frequency clock VCLK, and outputs the load signal when the clock count of the high frequency clock VCLK reaches the value of the conversion data for load signals. The load signal generation unit 2013 can be configured easily using a programmable counter, for example. If the load signal generation unit 2013 is enabled to digitally delay the phase of the load signal in dependence on the conversion data for load signals, the load signal generation unit 2013 can generate the load signal such that the clock modulation data is loaded at a desired timing.

Figure 6:
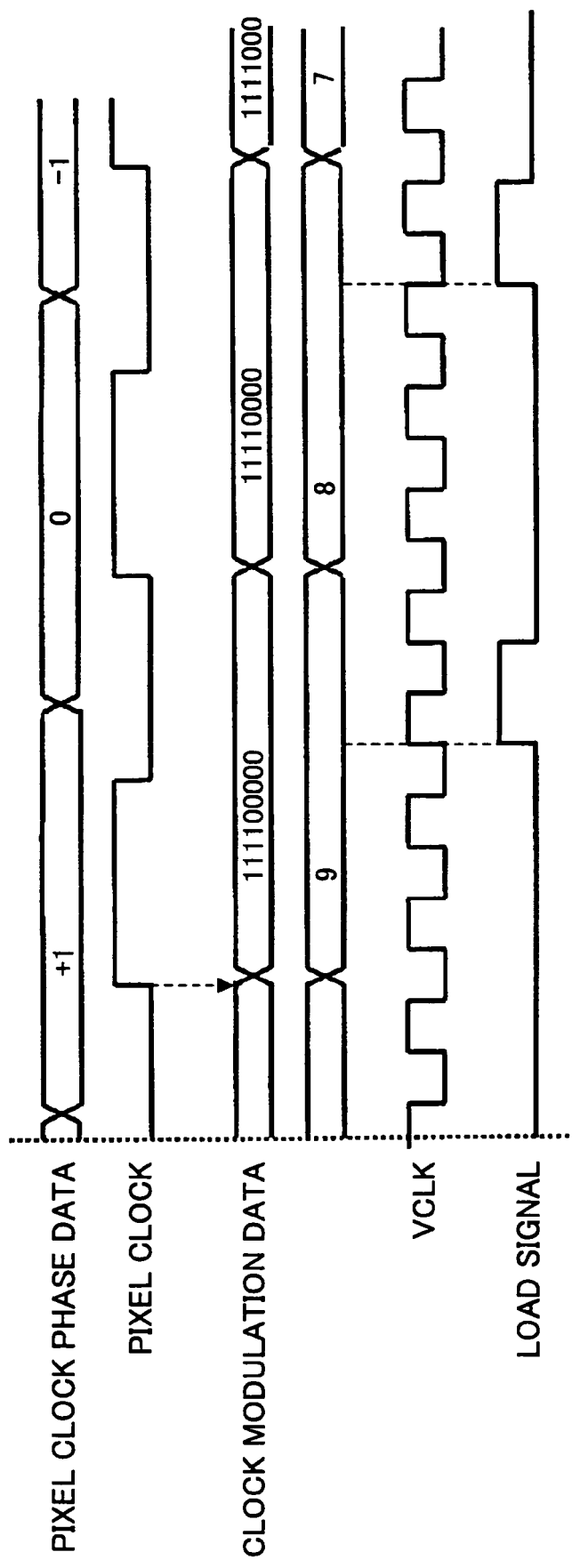
FIG. 6 is a timing chart showing the operation of the clock modulation data shown in FIG. 5.

FIG. 6 is a timing chart showing the operation of the clock modulation data generation unit 20 shown in FIG. 5. For example, while the pixel clock phase data is "+1", clock modulation data "111100000" is output and, when the clock count of VCLK reaches 9, the load signal is output. That is, the load signal is delayed in phase for 2 VCLK clocks. Those skilled in the art will understand the cases in which the pixel clock phase data is "0" and "−1" in the same manner.

An exemplary configuration of the modulation clock generation unit 30 shown in FIG. 1 is described below. The modulation clock generation unti 30 includes a shift register in various manners.

Figure 7:
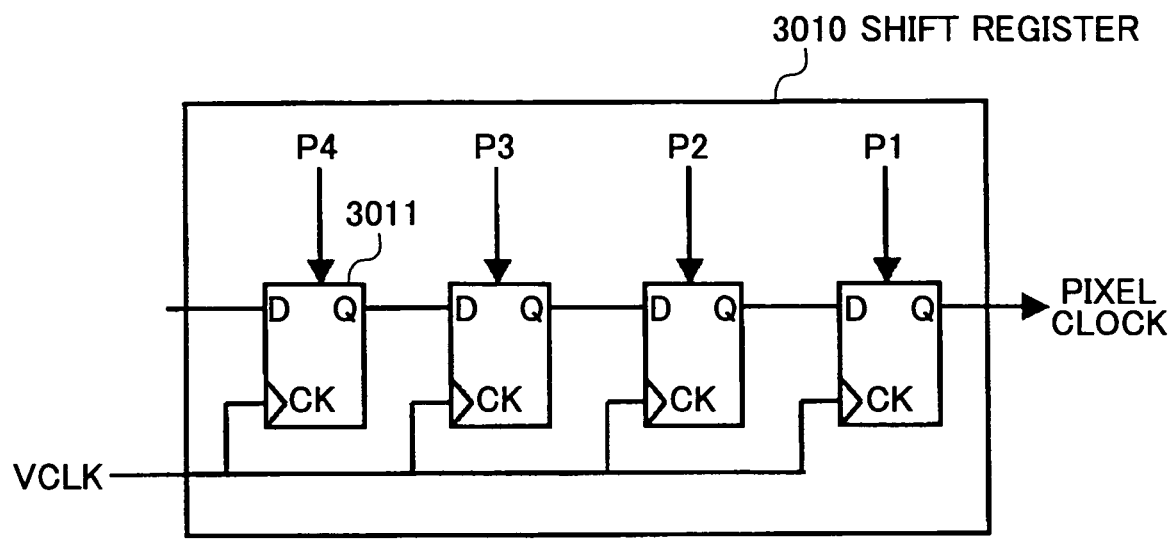
FIG. 7 illustrates a shift register according to an embodiment used in the modulation clock generation unit.

FIG. 7 illustrates the configuration of the modulation clock generation unit 30 according to an embodiment. FIG. 7 shows a modulation clock generation unit 30 using a single-stage (single-row) shift register. A shift register 3010 is configured by multiple flip-flops (FF) or latches 3011. The clock modulation data P1-P4 is input (loaded) in parallel, and serially shifted in accordance with the high frequency clock VCLK, and output as the pixel clock. The shift register 3010 has latches sufficient in number to load the clock modulation data of the maximum bit number. The clock modulation data is loaded with the most significant bit (MSB) latched in the top latch, the second most significant bit latched in the second top latch, and so on. Remaining latches remain idle. This situation is common to the case of multi-stage shift register to be described below.

Figure 8:
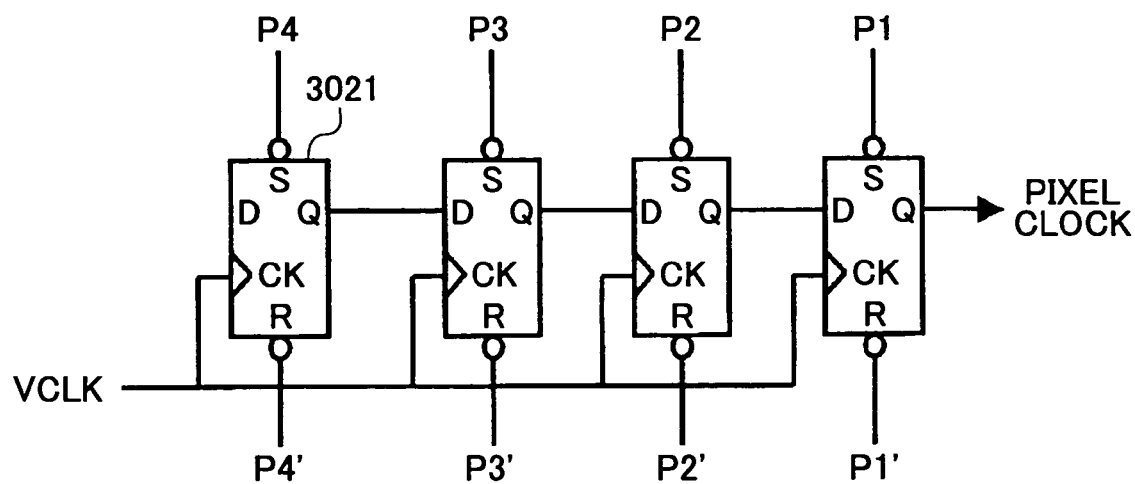
FIG. 8 illustrates a specific structure of a shift register.
Figure 9:
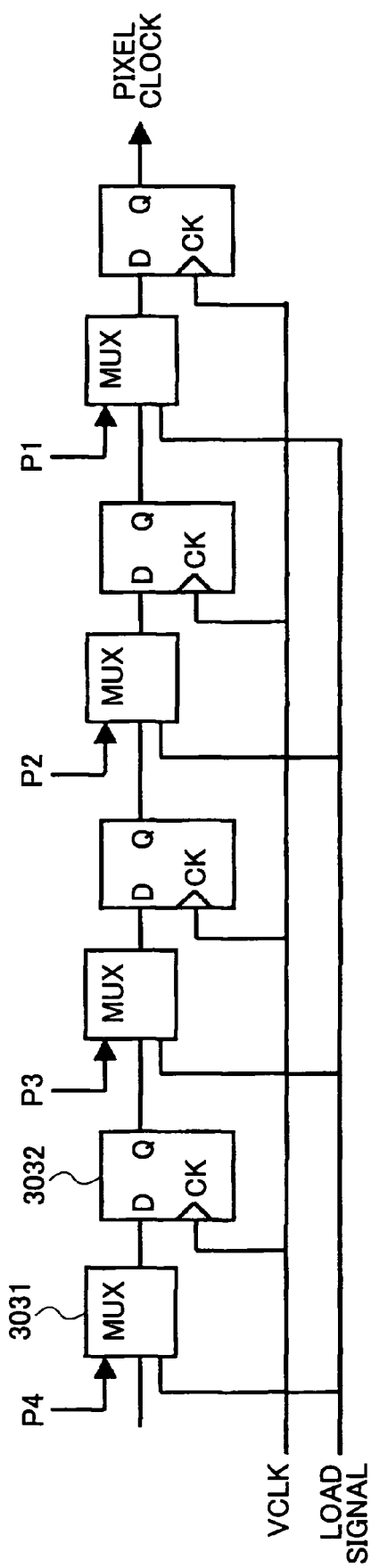
FIG. 9 illustrates another specific structure of the shift register.

FIGS. 8 and 9 illustrate specific structures of the shift register usable for the modulation clock generation unit 30. FIG. 8 illustrates a shift register using set-reset type FF's 3021, in which data is loaded by setting or resetting the FF's 3021. FIG. 9 illustrates a shift register using flip-flops (FF) 3032 and multiplexers (MUX) 3031, in which a determination is made of whether loaded data is shifted to the next FF 3032 by MUX 3031 or new data is set (loaded) in accordance with the load signal.

Figure 10:
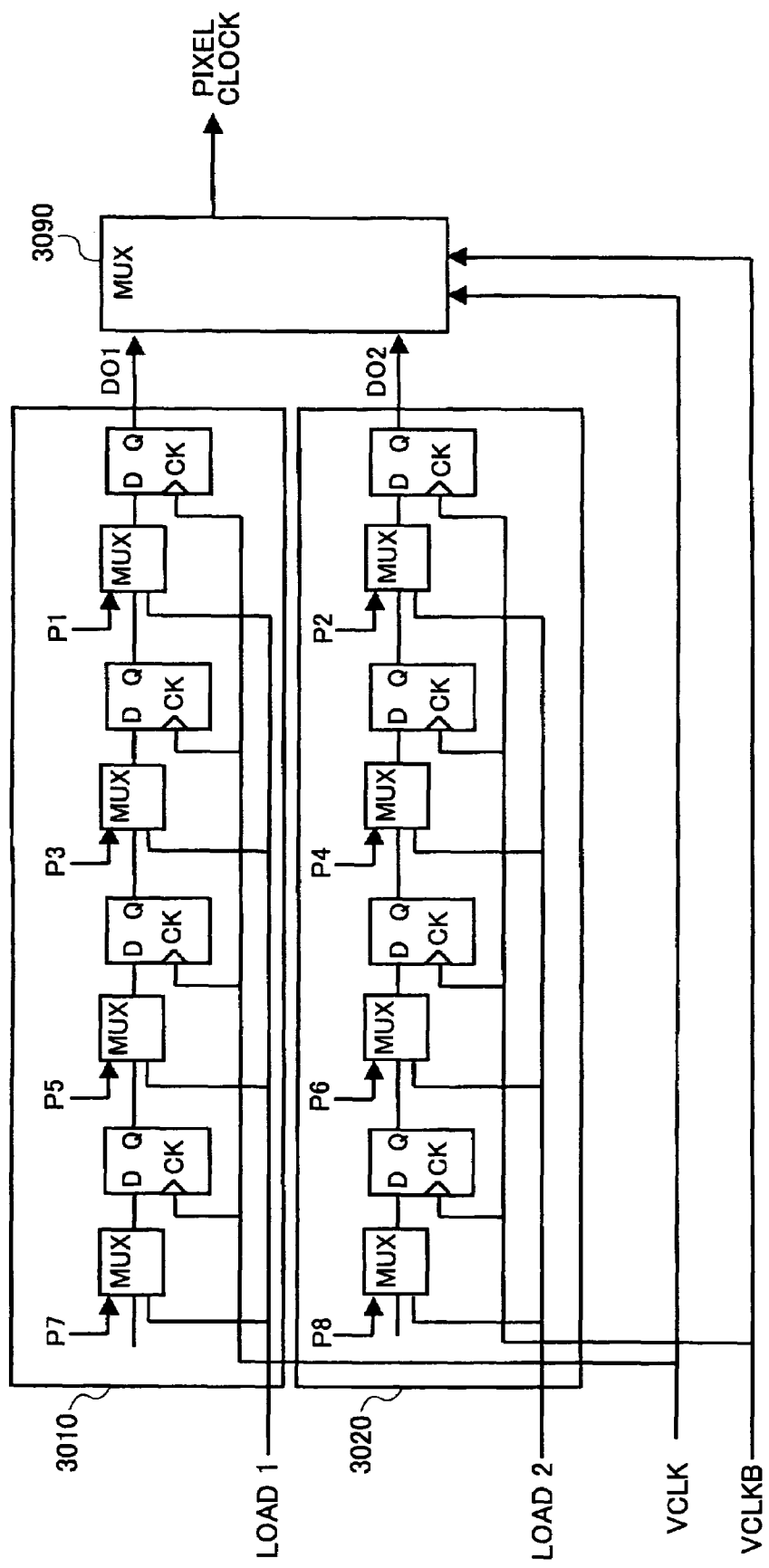
FIG. 10 illustrates an example of a two-stage shift register of a modulation clock generation unit.
Figure 11:
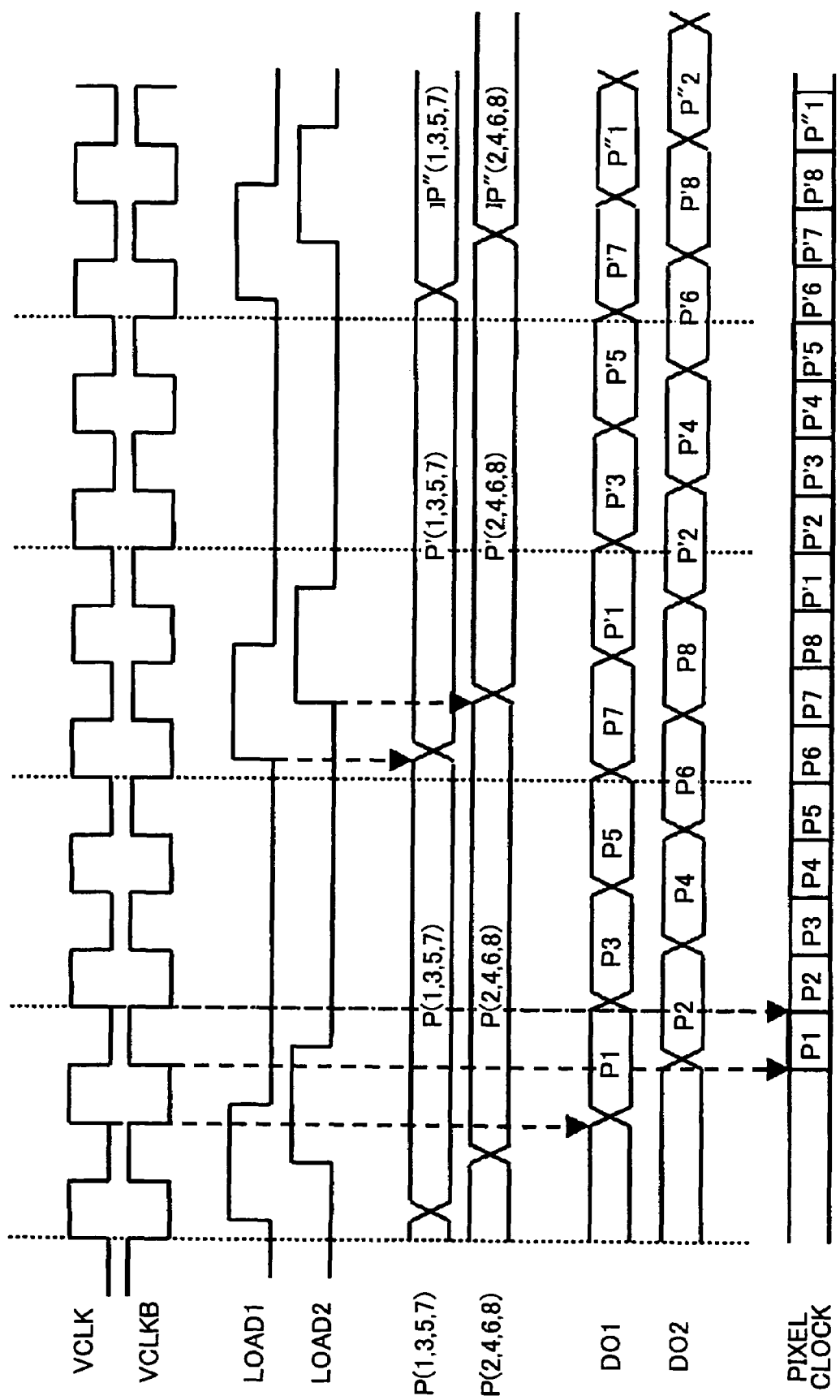
FIG. 11 is a timing chart showing the operation of the two-stage shift register shown in FIG. 10.

FIG. 10 illustrate specific configuration of the modulation clock generation unit 30 having dual-stage (dual-rows) shift register according to an embodiment. FIG. 11 is a timing chart showing the operation of the shift register. As shown in FIG. 10, the clock VCLK and its inverse VCLKB are used as high frequency clocks, and a signal LOAD 1 obtained by counting the clock VCLK and another signal LOAD 2 obtained by counting the clock VCLKB are used as load signals. The clock modulation data includes 8 bits P1-P8.

The shift registers 3010 in the upper row latch the data P1, P3, P5, and P7 in synchronization with the load signal LOAD 1, shifts serially the latched data in accordance with VCLK, and output the shifted data as data DO1. The shift registers 3020 in the lower row latch the data P2, P4, P6, and P8 in synchronization with the load signal LOAD 2, shifts serially the latched data in accordance with VCLKB, and output the shifted data as data DO2. A multiplexer (MUX) 3090 outputs the data DO1 in synchronization with VCLKB and the data DO2 in synchronization with VCLK. Following clock modulation data P'1-P'8, P"1-P"8 are processed in the similar manner. According to the above arrangements, pixel clock modulated in accordance with the clock modulation data is output from the MUX 3090.

In the case of the configuration shown in FIG. 10, the pixel clock can be output at double the speed of the high frequency clock VCLK. As a result, the system can be of higher speed and resolution.

Figure 12:
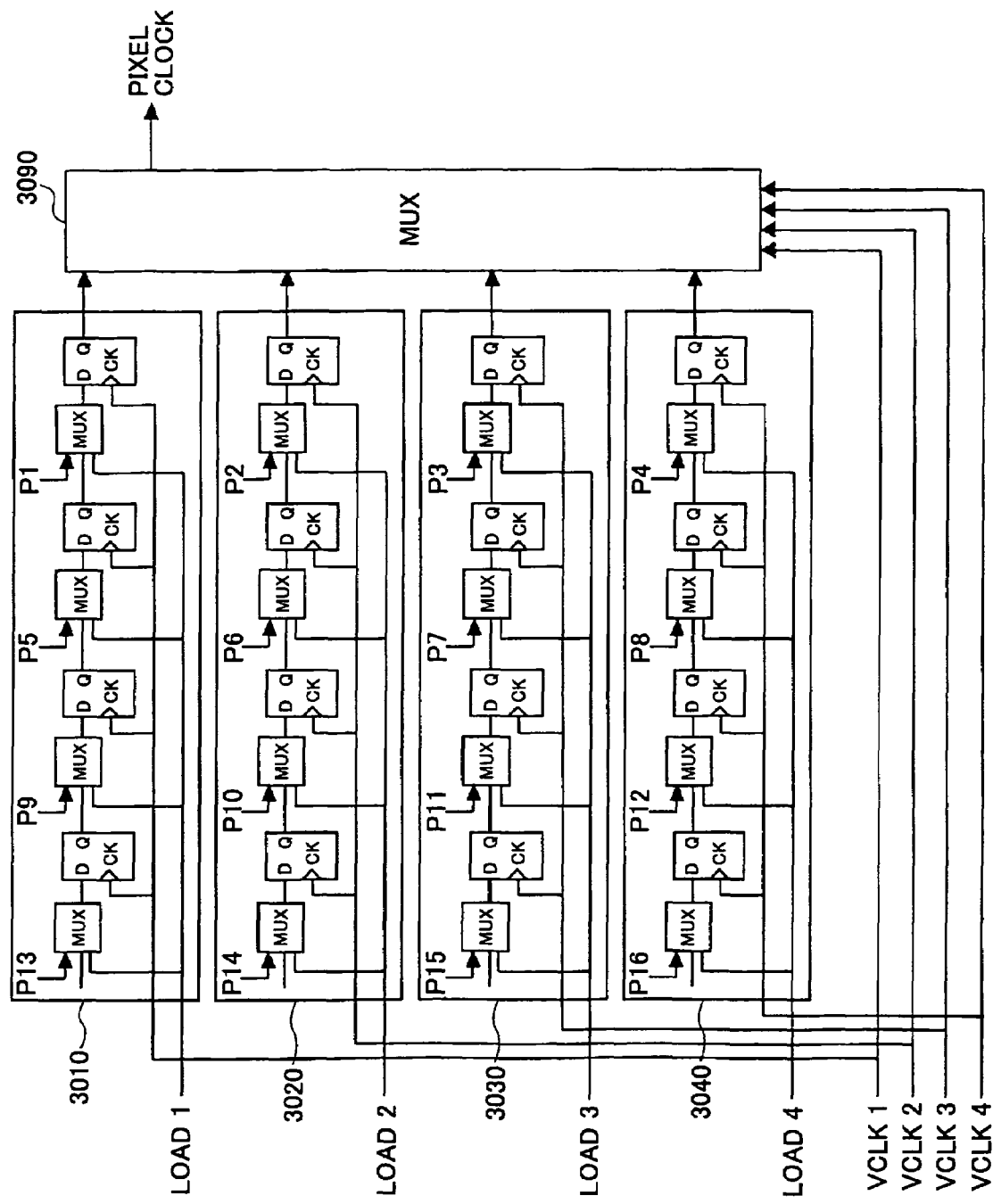
FIG. 12 illustrates an example of a four-stage shift register of a modulation clock generation unit.
Figure 13:
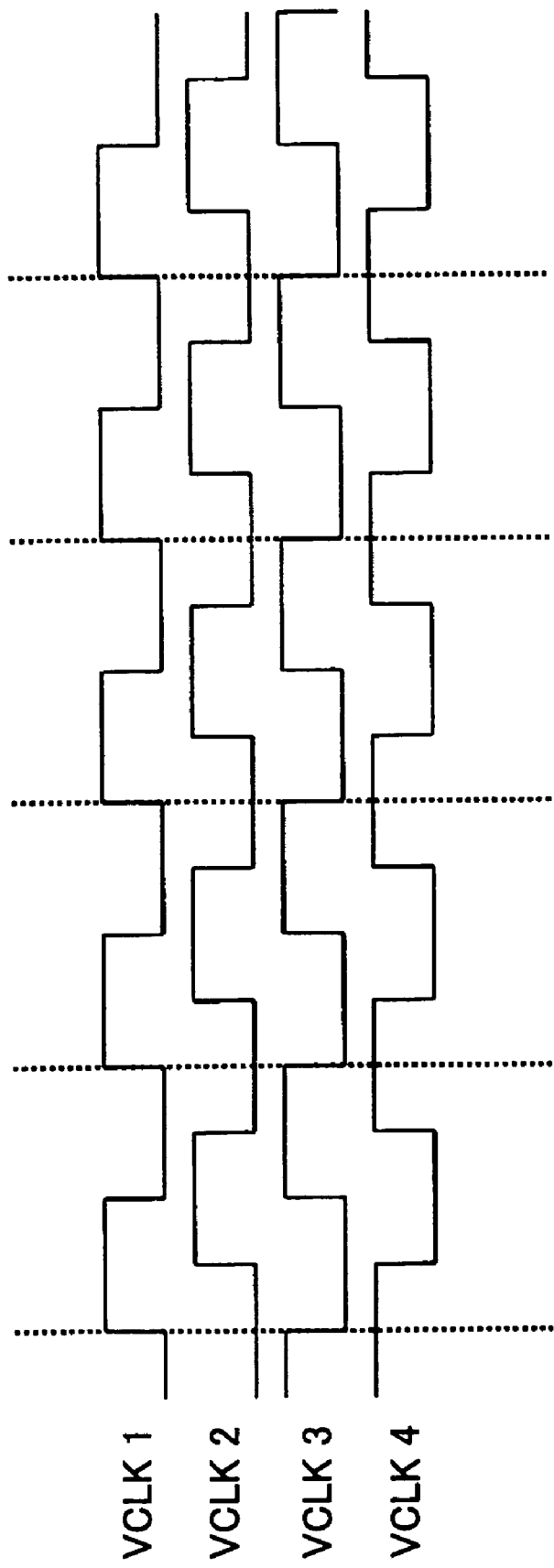
FIG. 13 is a timing chart showing the operation of the four-stage shift register shown in FIG. 12.

FIG. 12 illustrates an exemplary configuration of the modulation clock generation unit 30 having four-stage (four-rows) shift register according to an embodiment. Four-phase clocks VCLK1-VCLK4 are used as the high frequency clocks as shown in FIG. 13, and the load signals LOAD1-LOAD4 are used each obtained by counting the respective clock VCLK1-VCLK4. The clock modulation data has 16 bits P1-P16. The operation of the shift register shown in FIG. 12 is basically similar to that of the shift register shown in FIG. 10. The shift register 3010, 3020, 3030, and 3040 of each row is provided with the clock VCLK1, VCLK2, VCLK3, and VCLK4, respectively, and further provided with the load signal LOAD1, LOAD2, LOAD3, and LOAD4, respectively, which is in synchronization with each clock. The clock conversion data P1, P5, P9, and P13 is loaded to the shift register 3010 of the first row in the timing of the load signal LOAD1. The clock conversion data P2, P6, P10, and P14 is loaded to the shift register 3020 of the second row in the timing of the load signal LOAD2. The clock conversion data P3, P7, P11, and P15 is loaded to the shift register 3030 of the third row in the timing of the load signal LOAD3. The clock conversion data P4, P8, P12, and P16 is loaded to the shift register 3040 of the fourth row in the timing of the load signal LOAD4. The clock conversion data is serially selected by a MUX 3090 in accordance with VCLK4-VCLK1. According to the above arrangements, a pixel clock modulated in accordance with the clock modulation data P1-P6 is output.

The configuration shown in FIG. 12 can use clocks VCLK1-VCLK4, the phases of which are different by $\pi/2$ (90 degree) from each other as shown in FIG. 13, to output the pixel clock from multi-row shift registers without generating a clock the frequency of which is four times greater than that of VCLK. Even though the frequency of the "high frequency clock" is not high, if multiple high frequency clocks having different phases are combined, image clock of high frequency can be output by selecting the data based on the multiple high frequency clocks.

Figure 14:
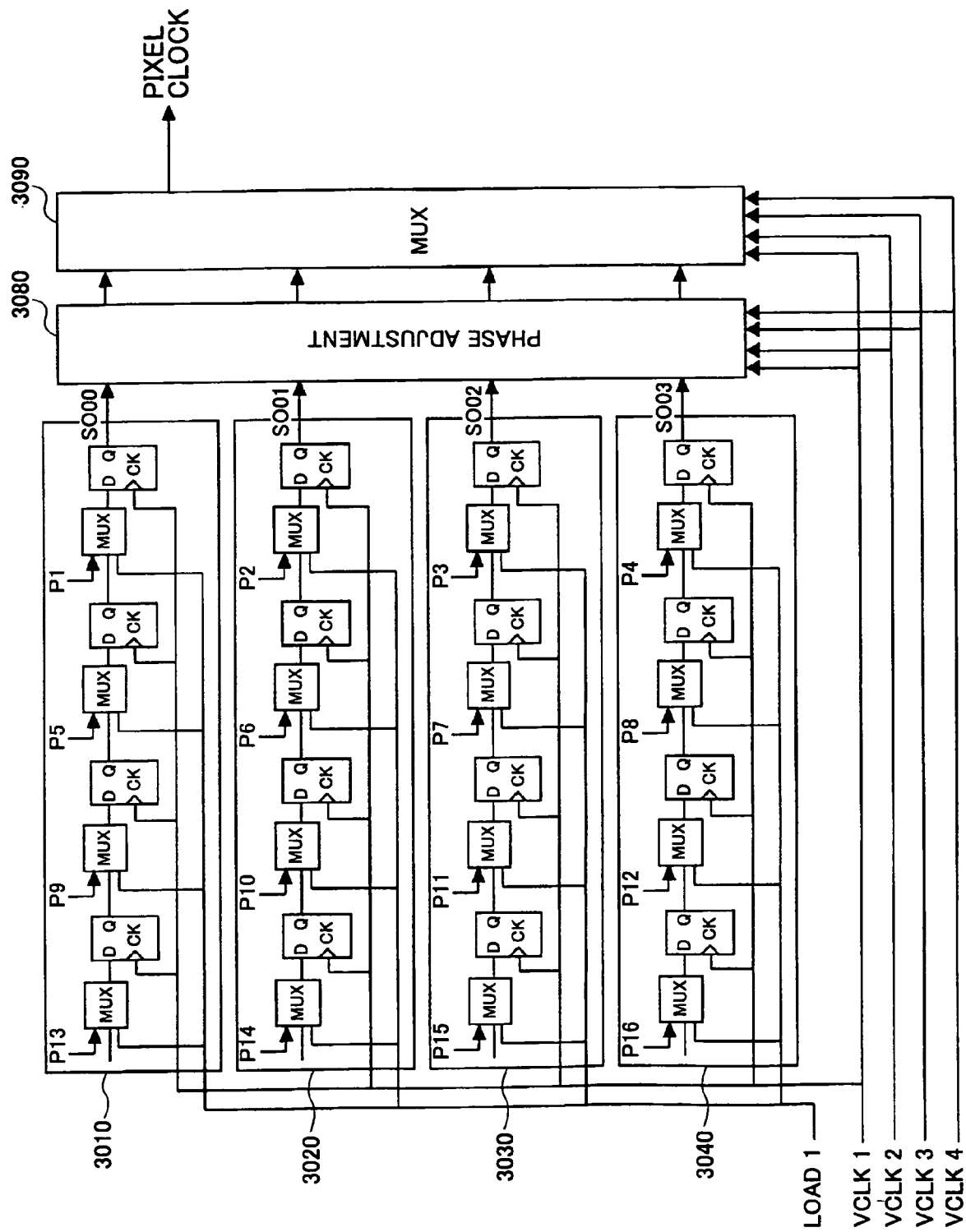
FIG. 14 illustrates another example of a four-stage shift register of a modulation clock generation unit.

FIG. 14 illustrate another exemplary configuration of a four-stage (four-rows) shift register included in the modulation clock generation unit 30 according to an embodiment. The basic concept of the modulation clock generation unit 30 shown in FIG. 14 is the same as that of the modulation clock generation unit 30 shown in FIG. 12. In FIG. 14, all shift registers 3010, 3020, 3030, and 3040 are operated based on a single clock VCLK1 and a load signal LOAD1 which is in synchronization with the VCLK1. A phase adjustment unit 3080 adjusts the phases of outputs SO00-SO03 from the shift registers 3010, 3020, 3030, and 3040, based on phase-different VCLK1-VCLK4. The phase adjusted outputs from the shift registers 3010, 3020, 3030, and 3040 are fed to MUX 3090.

Figure 15:
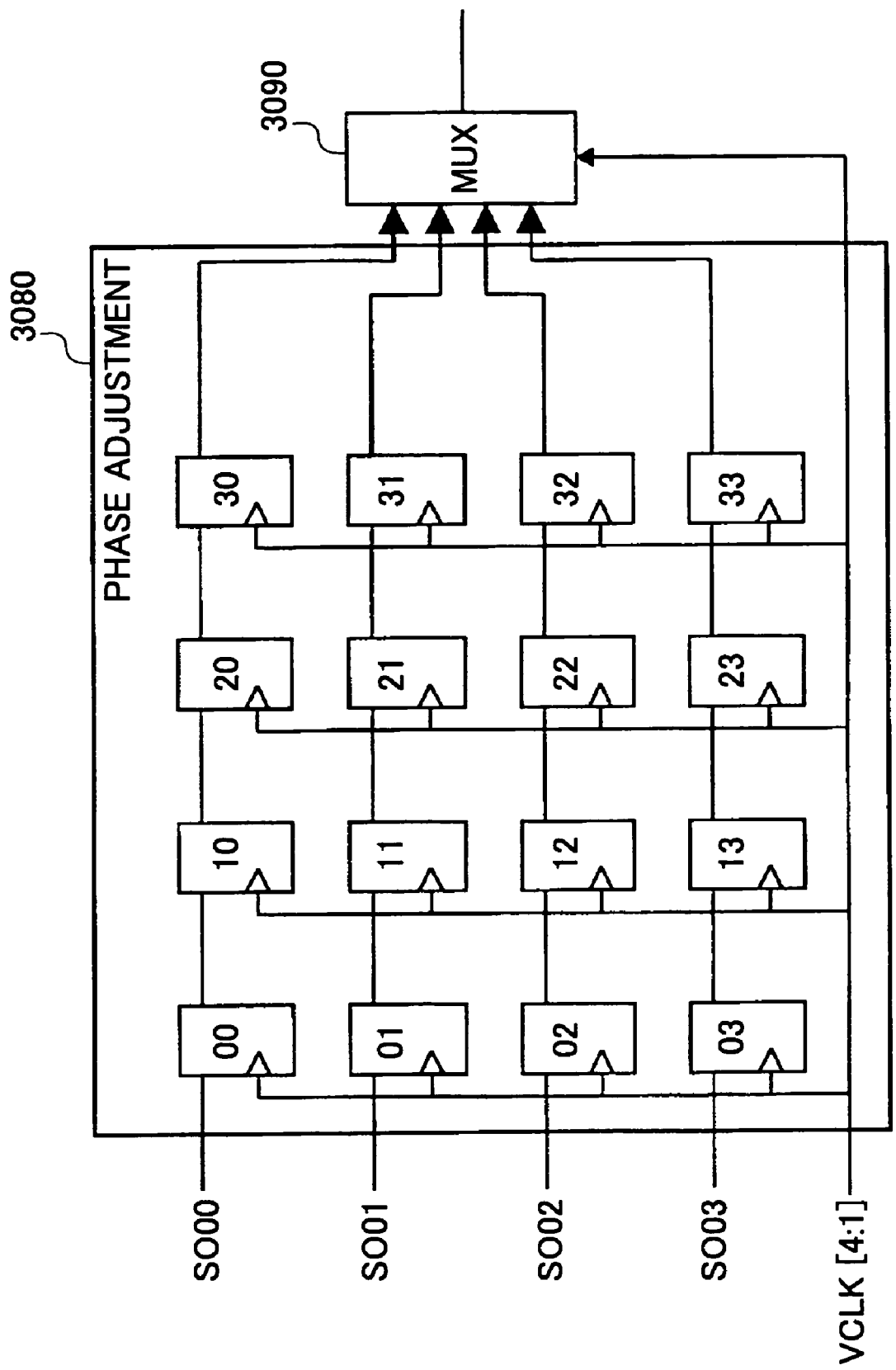
FIG. 15 illustrate the structure of the phase adjustment unit shown in FIG. 14.
Figure 16:
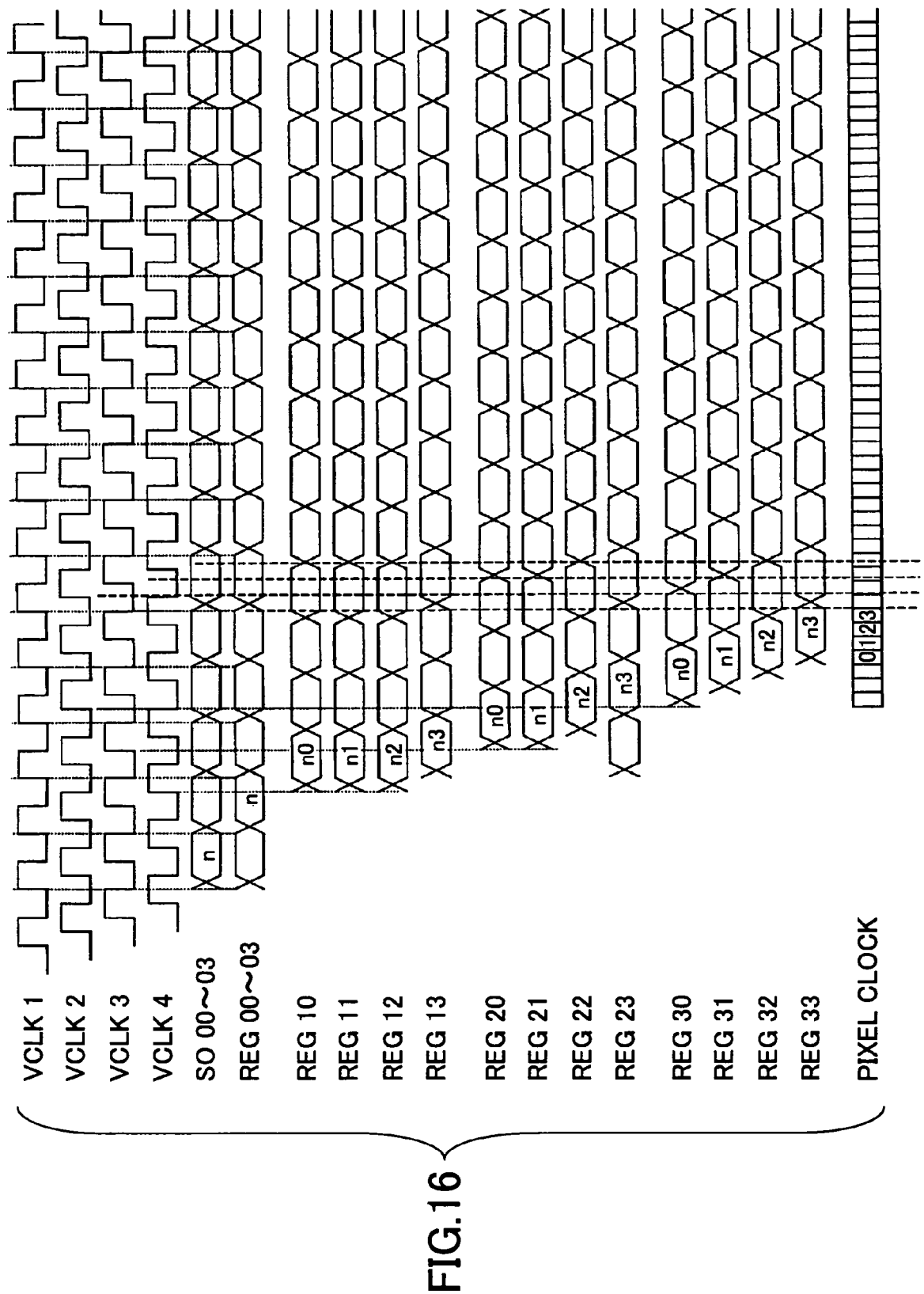
FIG. 16 is a timing chart showing the operation of the phase adjustment unit shown in FIG. 15.

FIG. 15 illustrate an exemplary configuration of the phase adjustment unit 3080 shown in FIG. 14, and FIG. 16 is a timing chart showing the operation of the phase adjustment unit 3080. The phase adjustment unit 3080 shown in FIG. 15 includes 4 rows×4 columns registers 00-33. The phase of clocks VCLK1-VCLK4 is different by 90 degree from each other as shown in FIG. 13. Input data SO00-SO03 is the output data from the shift registers 3010-3040 shown in FIG. 14, and is in synchronization with VCLK1. While each input data is transferred through the registers (REG), the phase of the input data is shifted. The MUX 3090 selects the output from REG 30-33 in a clock cycle in which the output of the REG 30-33 can be steadily latched. The MUX 3090 selects and outputs one of the output from REG 30-33 in a ¼ period of the VCLK1 cycle. For example, in the case of data SO00, since the MUX 3090 can select the output data n0 most steadily in a time period in which VCLK1 is high and VCLK2 is low, REG 30 is operated in accordance with VCLK2. In other words, the MUX selects and outputs the REG 30 in a time period in which VCLK1 is high and VCLK2 is low (the ¼ cycle immediately after the rise of VCLK1). The output from REG 30 needs to be stable during this time period. It is possible to secure the longest time period for the output data to become stable by operating REG 30 in accordance with VCLK2. Accordingly, REG 30 is operated in accordance with VCLK2. Similarly, REG 31 is operated in accordance with VCLK3. The cases of SO02 and SO03 are similar. According to the above arrangements, the MUX 3090 can steadily select the pixel clock n0, n1, n2, n3 in that order at high speed as shown in FIG. 16.

The REG 00-03 in the first column latch the input data SO00-SO03 at VCLK1. It is necessary to use VCLK the phase of which is delayed by ¾ VCLK cycle in order to adjust the phase of data as described above. For example, if the data latched in VCLK1 needs to be phase-adjusted and latched steadily, VCLK4 (not VCLK2 or VCLK3) is the most preferable cycle for the purpose of steady latch, taking set-up time and hold time into consideration, because the phase of VCLK4 is delayed by ¾ VCLK from VCLK1. Therefore, as shown in FIG. 15, the phase of the input data is shifted by three-stages of REG1x, REG2x, and REG3x (x: 0, 1, 2, 3). The number of stages needed for the phase shifting depends on the number of stages of the shift register (four stages in FIG. 14, for example) and the clock used for selecting the data by the MUX 3090.

The configuration shown in FIG. 14 needs the phase adjustment unit 3080 for adjusting the phase of the shift register output, but this configuration can be made simple because a single clock and a single load signal LOAD1 that is synchronization with the single clock need to be provided to the four-rows shift register 3010-3040. As described above, the MUX 3090 can convert the outputs from four-row shift registers into a serial image clock by selecting the shift register output by selecting the clock in which the output can be steadily latched.

Exemplary shift registers having up to four rows are described as the modulation clock generation unit 30. According to another embodiment, the number of rows may be further increased for the generation of serial image clock. In addition, according to the above embodiments, the number of input data that can be input to a shift register is up to four, but the number of input data may be further increased in dependence on the resolution of a cycle of image clock and the method of generation of the high frequency clock.

The high frequency clock generation unit shown in FIG. 1 is further described below in detail.

Figure 17:
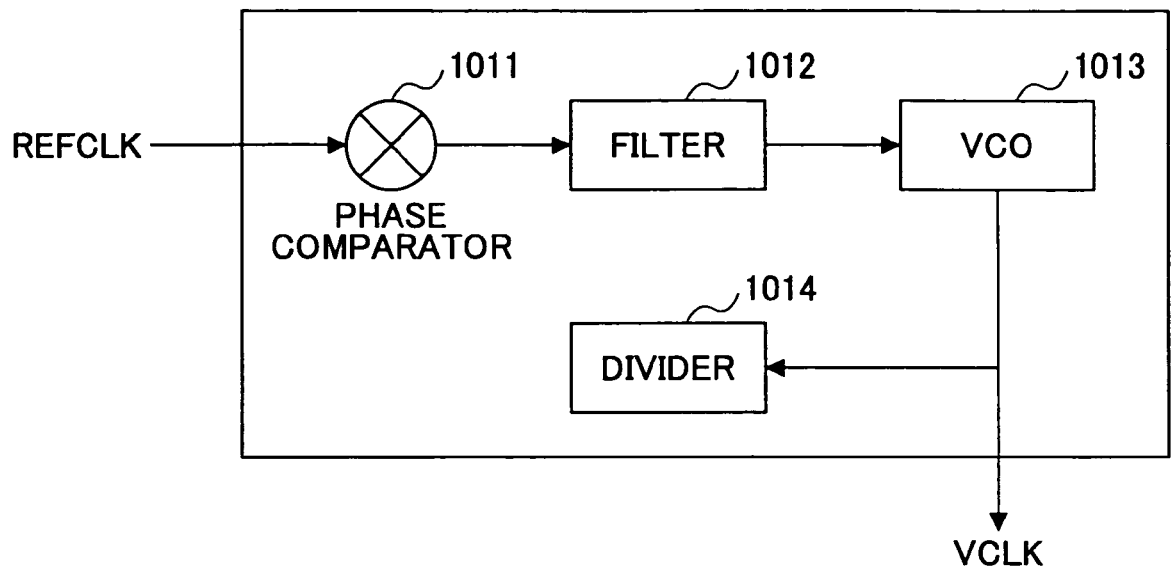
FIG. 17 illustrates the structure of a high frequency clock generation unit.

FIG. 17 illustrates the configuration of the pixel clock generation unit 10 according to an embodiment. This pixel clock generation unit 10 uses a so-called PLL circuit, and includes a phase comparator unit 1011, a loop filter unit 1012, a voltage controlled oscillator (VCO) unit 1013, and a divider unit 1014. The pixel clock generation unit 10 can generate high frequency clock VCLK, the phase of which is adjusted to a reference clock REFCLK (pixel clock, for example), and the frequency of the high frequency clock VCLK is N times as high as that of the reference clock REFCLK. The duty ratio of VCLK is about 50%. An inverse clock VCLKB can be generated by inverting the VCLK output from VCO 1013. Multiple phase clocks VCLK1, VCLK2, ..., VCLKn, the phase of which is different from each other, can be generated by modifying VCO 1013 so as to generate the multiple phase clocks. Such multi-phase clocks can be generated by adding a delay lock loop (DLL) circuit to the output of the VCO 1013, which is described below in more detail.

Figure 18:
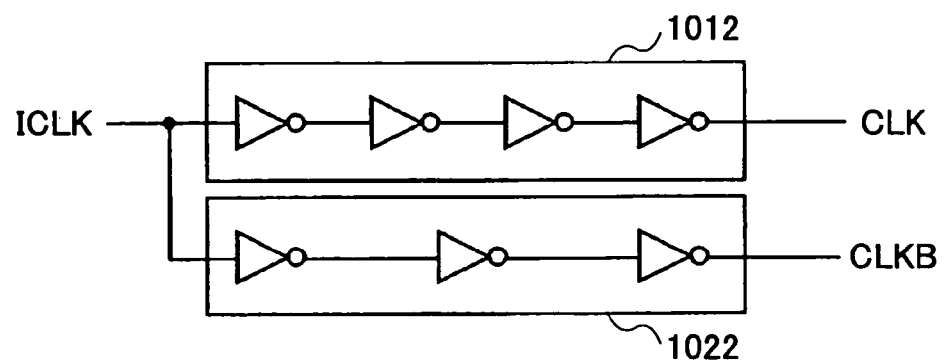
FIG. 18 illustrates an inverse clock generation circuit.

FIG. 18 illustrates an exemplary inverted clock generation circuit according to an embodiment. Input clock ICLK (VCLK) is input to an even-number-stage inverter 1021 and an odd-number-stage inverter 1022 for adjusting the delay caused by the inverters 1021 and 1022. Thus, the inverted clock generation circuit shown in FIG. 18 can generate a non-inverted clock CLK and an inverted clock CLKB, the phase of which is different by π (180 degree) from CLK. The non-inverted clock CLK and the inverted clock CLKB can be used as the high frequency clocks VCLK and VCLKB, respectively.

Figure 19:
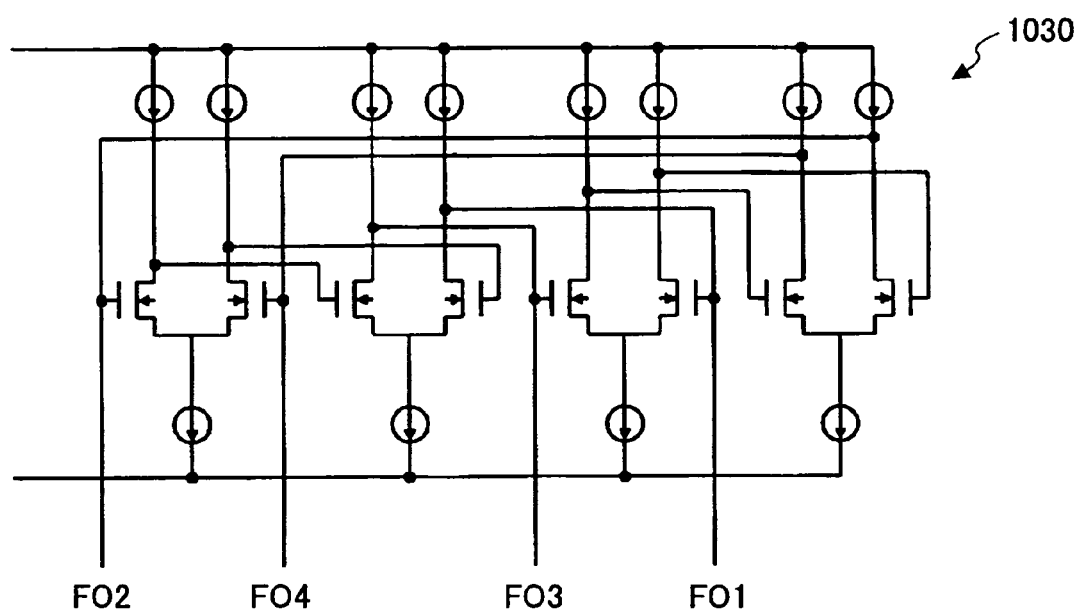
FIG. 19 illustrates a multi-phase clock generation circuit according to an embodiment.
Figure 20:
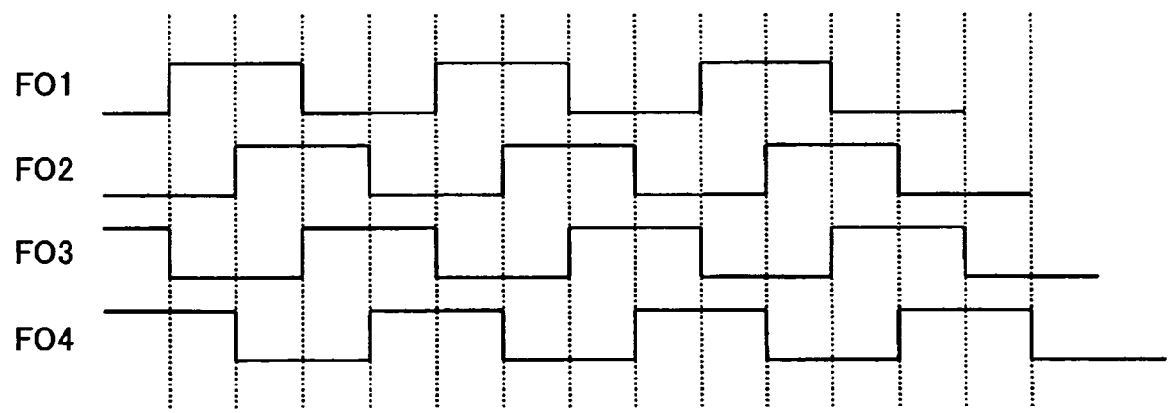
FIG. 20 is a timing chart showing the operation of the multi-phase clock generation circuit shown in FIG. 19.

FIG. 19 illustrates an exemplary multi-phase clock generation circuit according to an embodiment, and FIG. 20 is a timing chart showing the operation thereof. FIG. 19 shows an exemplary configuration of the VCO 1013 shown in FIG. 17. This VCO is configured by four-stage differential type ring oscillator 1030, and clocks the phase of which is different by π/2 (90 degree) from each other are output from FO1-FO4 as shown in FIG. 20. These clocks FO1-FO4 can be used, for example, as the high frequency clocks VCLK1-VCLK4 of the shift register shown in FIG. 12. According to the above arrangements, the differential type ring oscillator shown in FIG. 19 does not have an inverted clock generation unit for inverting clocks, but still can generate non-inverted clock and inverted clock the phase of which is different from that of the non-inverted clock by π (180 degree) easily. If the ring oscillator has even number-stages and outputs intermediate phase, clocks the phase of which is different by a certain quantity can be generated.

In the case of the ring oscillator shown in FIG. 19, every other differential stage is output so as to output four-phase clocks the phase of which is different from each other by π/2 (90 degree). If each differential stage is output, the ring oscillator can output eight-phase clocks the phase of which is different from each other by π/4 (45 degrees). Similarly, if the ring oscillator has three stages, the ring oscillator can output six-phase clocks the phase of which is different from each other by π/3 (60 degree). Thus, the ring oscillator can be designed so as to output clocks of any number of phase.

Figure 21:
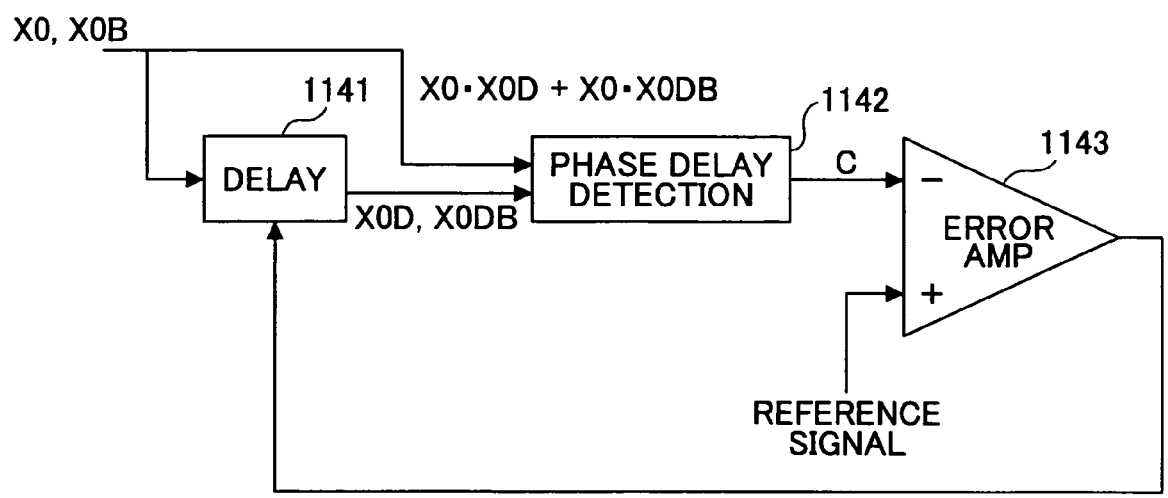
FIG. 21 illustrates an example of a delay quantity control unit used for the multi-phase clock generation circuit according to an embodiment.

FIG. 21 illustrates a delay control unit according to an embodiment used for a circuit for generating multi-phase clocks, the phase difference is controlled. Clock X0 and its inversion X0B generated by the inverted clock generation unit shown in FIG. 18, for example, are fed to a delay unit 3041. The clocks X0D and X0DB delayed by the delay unit 3041 and the original clock X0 and X0B are fed to a phase delay detection unit 1042. The phase difference between the original clock X0, X0B and the delayed clock X0D, X0DB is compared with a reference signal by an error amp 1043. The output signal of the error amp 1043 is fed back to the delay unit 1041 thereby to control the delay quantity.

Figure 22:
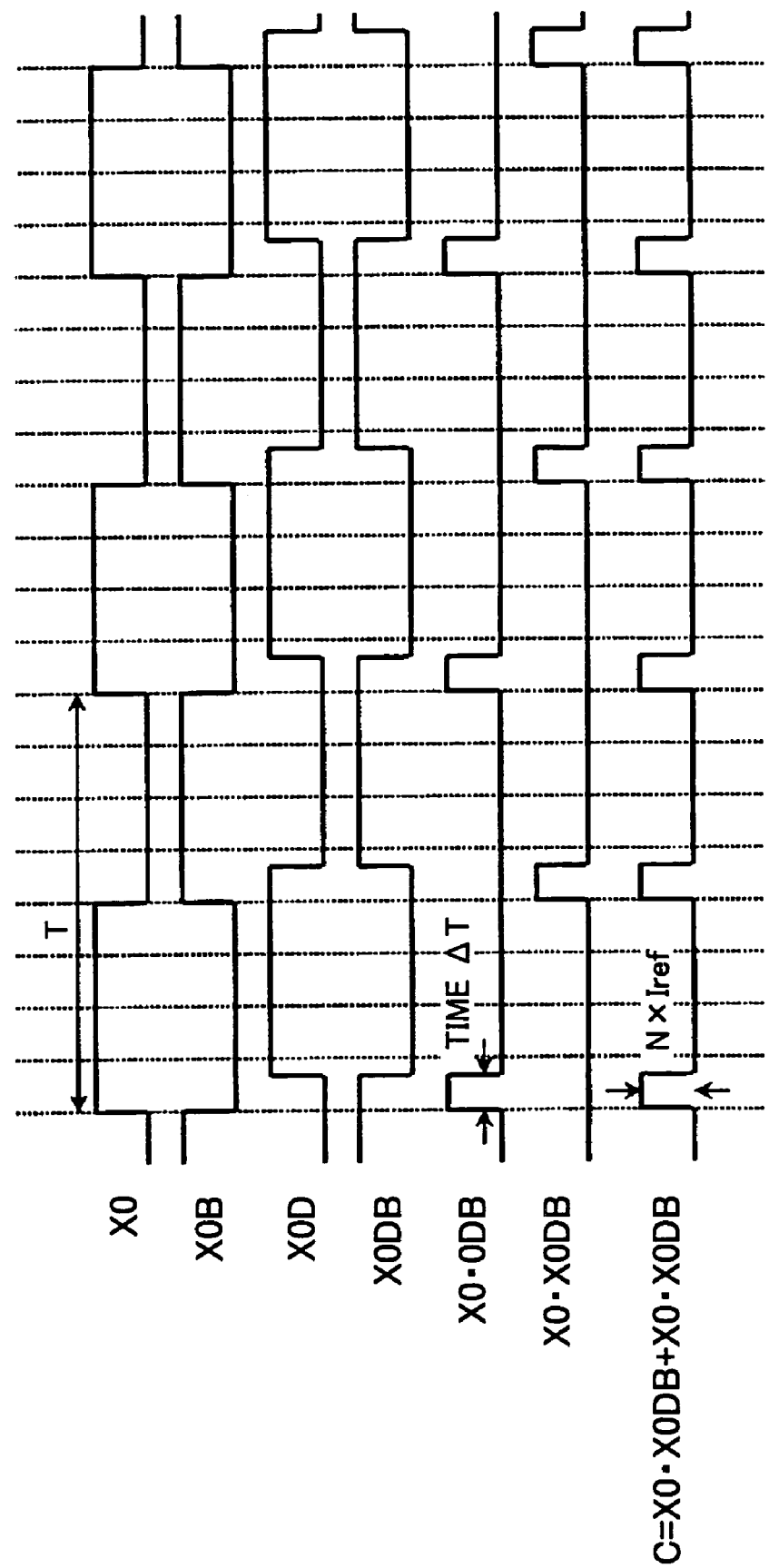
FIG. 22 is a timing diagram showing the operation of the delay quantity control unit shown in FIG. 21.

FIG. 22 is a timing chart showing the operation of the delay quantity control unit shown in FIG. 21. The original clocks X0 and X0B are delayed by a time period ΔT by the delay unit 1041, thereby to form the delayed clocks X0D and X0DB. The logic of the phase delay detection unit 1042 is expressed as C=X0\*X0DB+X0B\*X0D, where C is the output of the phase delay detection unit 1042. This logic is determined such that, even if the duty ratio of the input pulses X0 and X0B is not 50%, the detection of the delay quantity becomes accurate. The output signal C from the phase delay detection unit 1042 has waveform in which pulses of delay time ΔT appear in T/2 cycle in this case. The output signal C from the phase delay detection unit 1042 is current output, which is N×Iref, where N is determined as follows.

The error amp 1043 compares the current output C from the phase delay detection unit 1042 with a reference current Iref that is a reference signal, and generates current Idelay that determines the delay quantity of the delay unit 1041. In the case in which N=4, if ΔT=T/8, the integration value of the integrated waveform of C becomes Iref. Therefore, the delay quantity of the delay unit 1041 is controlled such that the delay time ΔT=T/8. In general, the delay time can be expressed as ΔT=T/2N. That is, the delay time ΔT can be controlled within a range of T/2, which is the half of the width of the input signals X0 and X0B by determining the number N.

Figure 23:
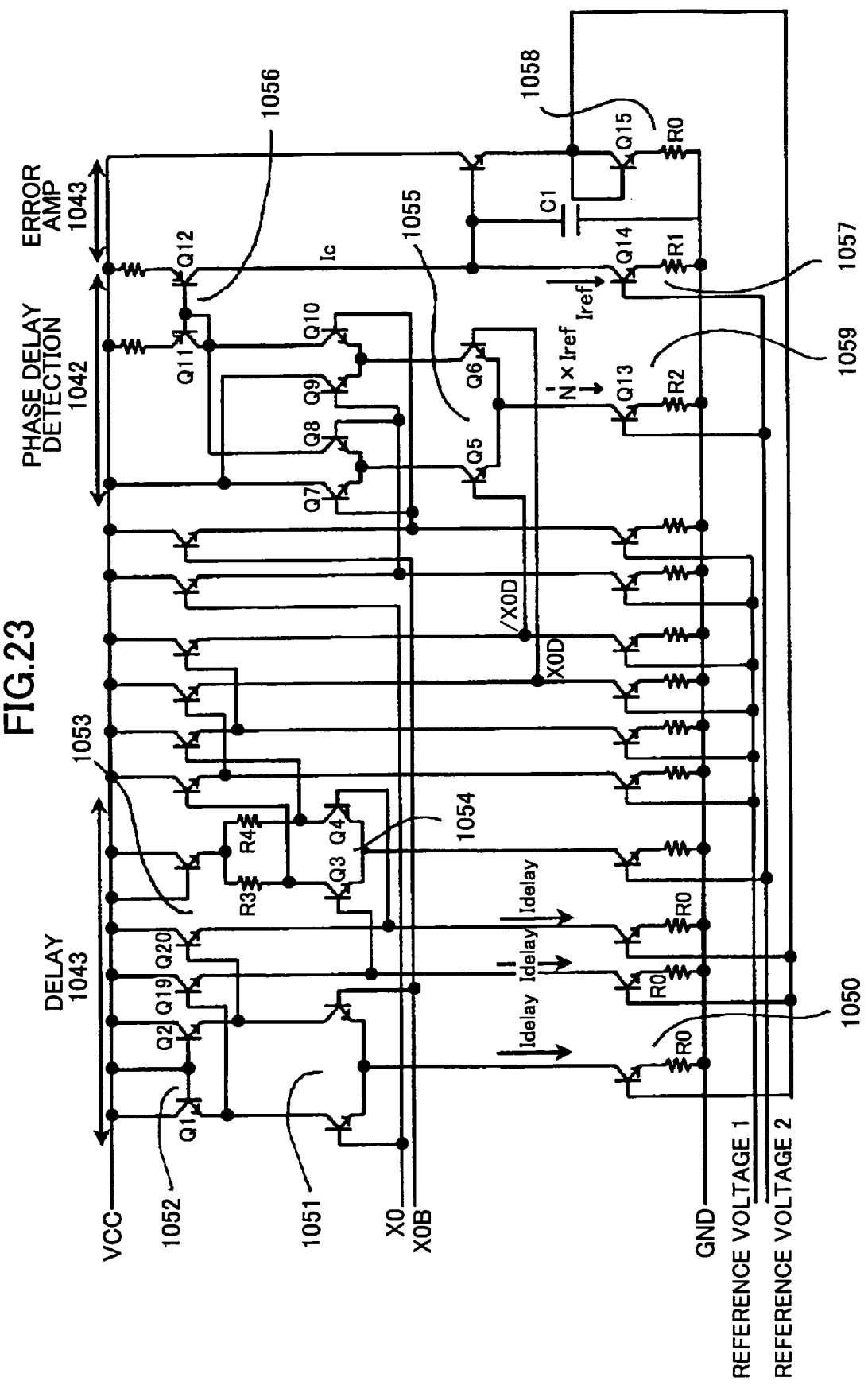
FIG. 23 illustrates an exemplary circuit of the delay quantity control unit shown in FIG. 21.

FIG. 23 is a circuit diagram showing an exemplary circuit of the delay quantity control unit shown in FIG. 21, configured by bipolar transistors. A current source 1150 configured by transistors Q16-Q18 and a resistance R0 generates the current Idelay that determines the delay quantity of the delay unit 1141. The input pulse signals X0 and X0B are delayed a diode load circuit 1052 consisting of transistors Q1, Q2, an emitter follower circuit 1053 consisting of transistors Q19, Q20, via a differential circuit 1051 consisting of transistors Q21, Q22.

The amplitude of output from the diode load circuit 1052 consisting of the transistors Q1, Q2 is very small. The output signal from the emitter follower circuit 1053 consisting of the transistors Q19, Q20 is output through a binary circuit 1054 consisting of transistors Q3, Q4, and transistors R3, R4, thereby to control swing. An ECL logic circuit 1055 consisting of transistors Q5-Q10 outputs C=X0B*X0D+X0*X0DB, where X0D and X0DB being the input signals from the binary circuit 1054. The output current Ic of the ECL logic circuit 1055 is inverted by a current mirror circuit 1056 consisting of transistors Q11, Q12, and is compared with a reference current Iref generated by a transistor Q14 and a resistance R1. The corrector of the transistor Q14 of a comparator unit 1057 is of high impedance, a capacitor C1 is connected to the ground GND. Therefore, IC and Iref are compared, and a current source 1058 consisting of a transistor Q15 and a resistance R0 generates the comparison output.

A current mirror circuit is formed by current sources 1150 and 1058 having the same resistance R0, and the same current flows the current sources 1150 and 1058. That is, current generated by the transistor Q15 and the resistance R0 becomes Idelay. The output current Idelay of the current mirror circuit consisting of the transistors Q15-Q18 and the resistance R0 is controlled by the output from the transistor Q15 and the resistance R0.

If the current from a current source 1059 consisting of a transistor Q13 and a resistance R2 is N times Iref, the delayed pulse signals X0D, X0DB can be obtained, in which the delay time ΔT=T/2N. For example, in the case of N=4, if parameters are determined such that R1:R2=4:1, and the area factor (emitter area) of Q13:the area factor of Q14=4:1, it is possible that accurate current of 4×Iref flows through the current source 1059 consisting the transistor Q13 and the resistance R2. The delayed pulse X0D, X0DB of delay time ΔT=T/8, that is, the phase delay quantity of Δθ=π/4.

Figure 24:
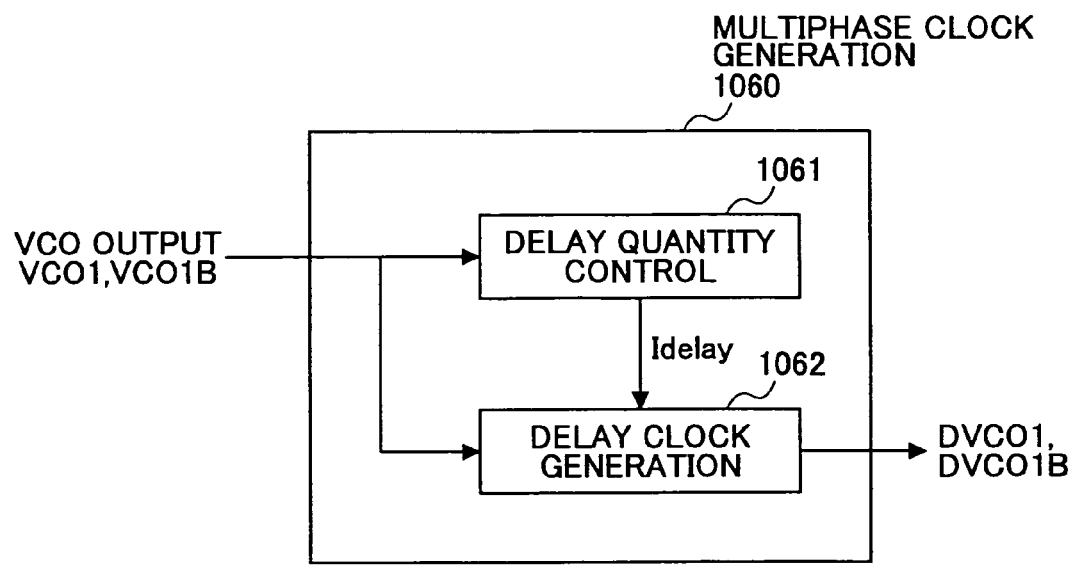
FIG. 24 illustrates a multi-phase clock generation circuit used fro the delay quantity control unit of FIG. 21.
Figure 25:
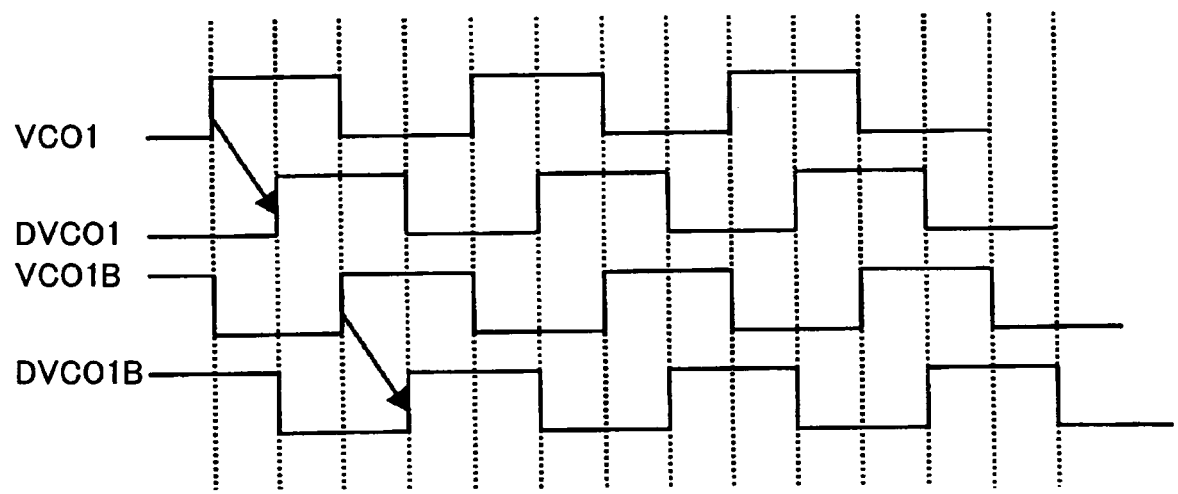
FIG. 25 is a timing chart showing the operation of the multi-phase clock generation circuit of FIG. 24.

FIG. 24 illustrates an exemplary multi-phase clock generation circuit using the above delay quantity control unit. For example, the-clock VCO1 (VCLK) and its inversion VCO1B (VCLKB) generated from the output of VCO 1013 shown in FIG. 17 are fed to a delay quantity control unit 1061 and a delay clock generation unit 1062 of a multi-phase clock generation circuit 1060. The delay quantity control unit 1061 includes the delay unit, the phase delay detection unit, and the error am shown in FIGS. 21 and 23. The output from the delay quantity control unit 1061 is the control current Idelay that controls the delay quantity. The delay clock generation unit 1062 may be identical to the delay quantity generation unit 1041 shown in FIG. 23, which outputs the clocks DVC01, DVC01B, the delay quantity of which is controlled based on the control current Idelay. FIG. 25 illustrates an example in which four-phase clocks, the phase of which is different by 90 degree from each other, is generated from dual-phase clocks (non-inverted and inverted clocks).

Figure 26:
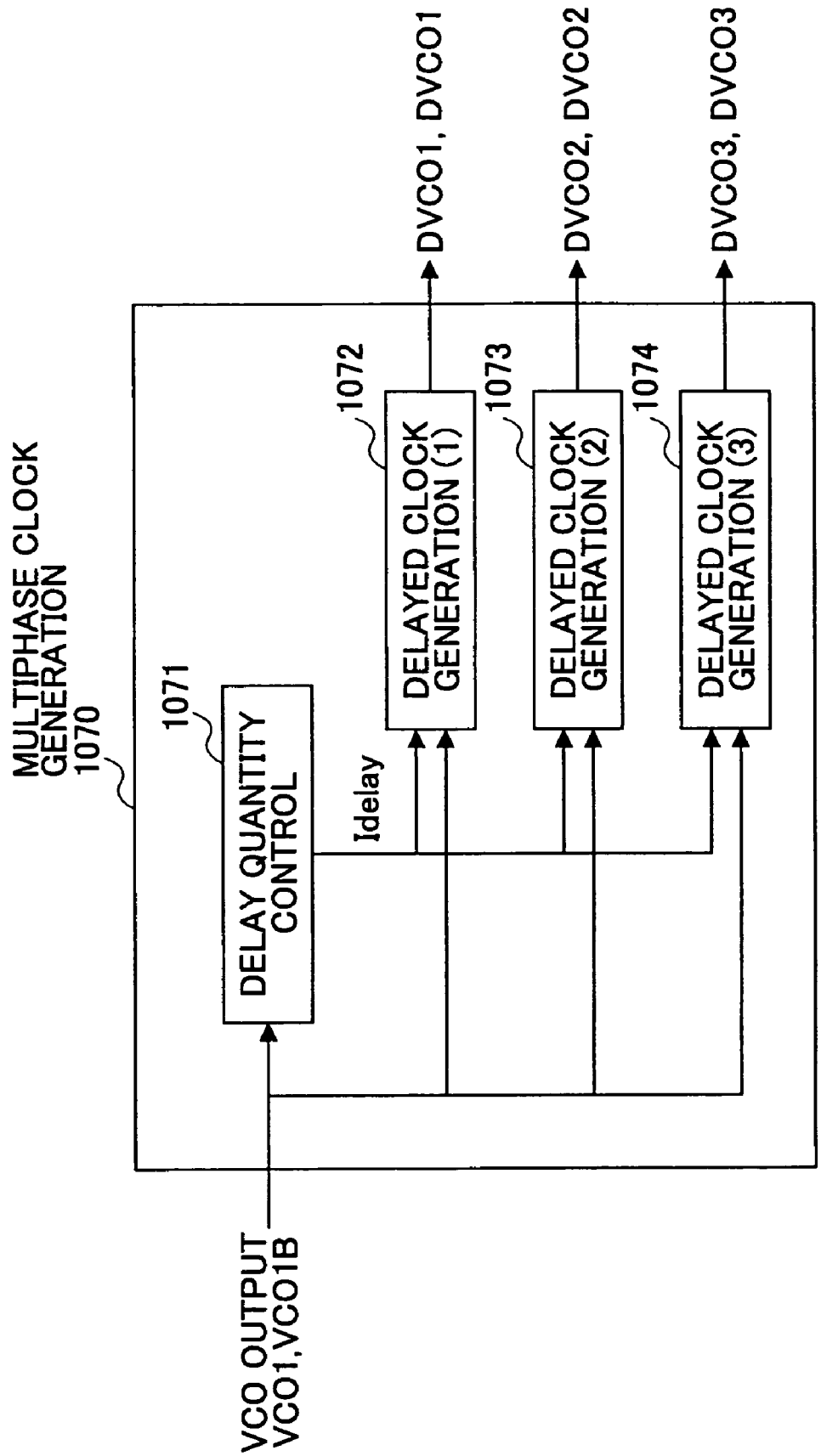
FIG. 26 illustrates a multi-phase clock generation circuit according to another embodiment.

FIG. 26 illustrates an exemplary multi-phase clock generation circuit according to yet another embodiment different from that shown in FIG. 24. The multi-phase clock generation circuit 1070 has three delay clock generation units 1072, 1073, 1074, which allows eight-phase clock the phase of which is different from each other by 45 degree to be generated. Similarly, it is possible to generate clocks, the phase difference is adjustable at designer's discretion and controllable.

Figure 27:
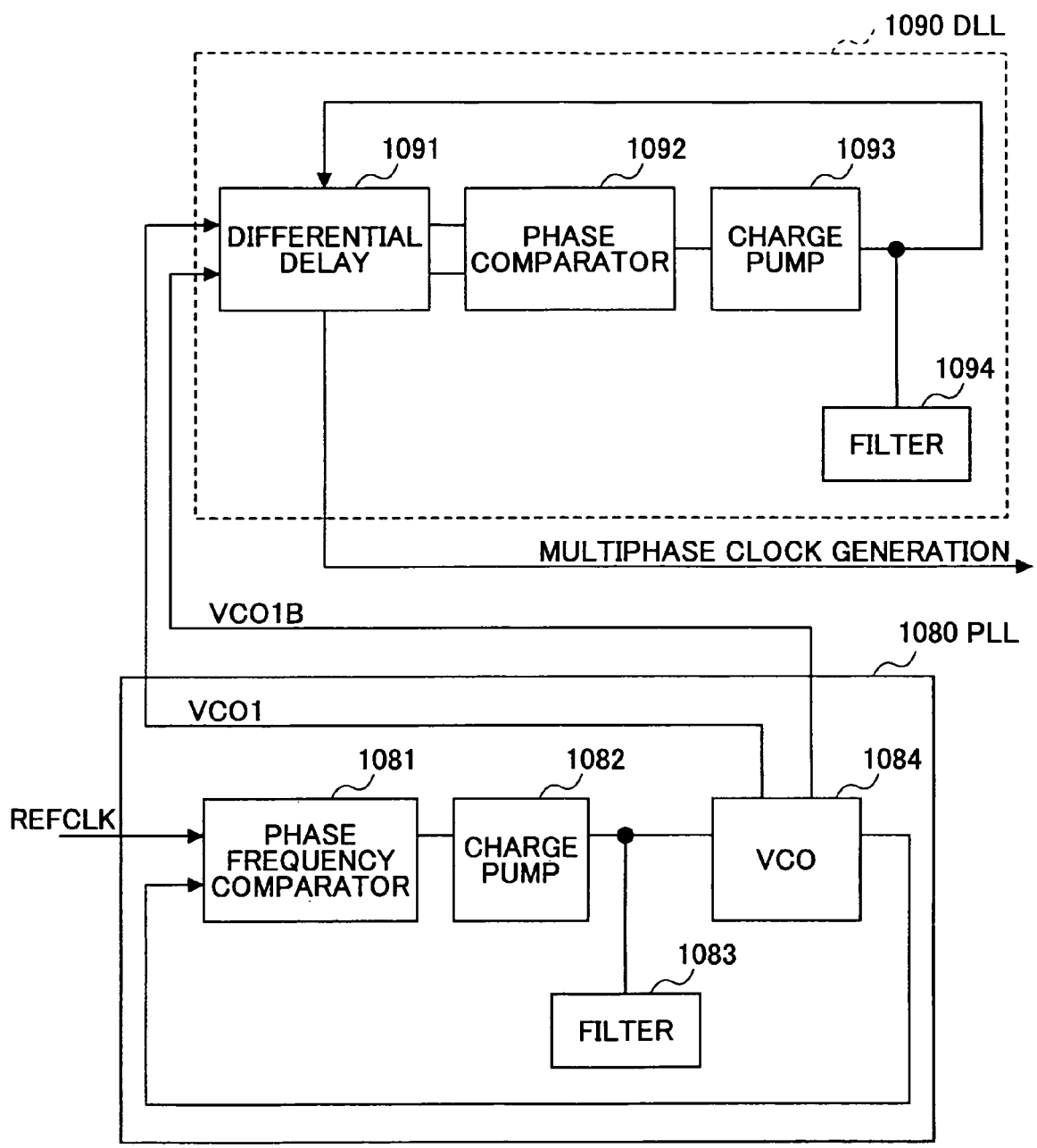
FIG. 27 illustrates a multi-phase clock generation circuit according to yet another embodiment.

FIG. 27 illustrates an exemplary multi-phase clock generation unit using a delay lock loop (DLL) circuit according to an embodiment. In FIG. 27, a phase frequency comparator 1081, a charge pump 1082, a filter 1083, and a VOC 1048 constitute a PLL circuit 1080, the operation of which is basically the same as that of the PLL circuit shown in FIG. 17. The VOC 1084 outputs VCO1 and its inversion VCO1B. A DLL circuit 1090 includes a differential delay unit 1091, a phase comparator 1092, a charge pump 1093, and a filter 1094. The output VCO1 and its inversion VCO1B of the VCO 1084 are fed to the differential delay unit 1091, and multi-phase clocks the number of which depends on the number of stages of the differential delay unit 1091. Clock the phase of which is delayed by 360 degree from a reference clock output from the differential delay unit 1091 is fed to the phase comparator 1092, and the output of the phase comparator 1092 is fed to the differential delay unit 1091 via the charge pump 1093 thereby-to control the delay quantity. Thus, multi-phase clocks of high phase accuracy can be generated.

Figure 28:
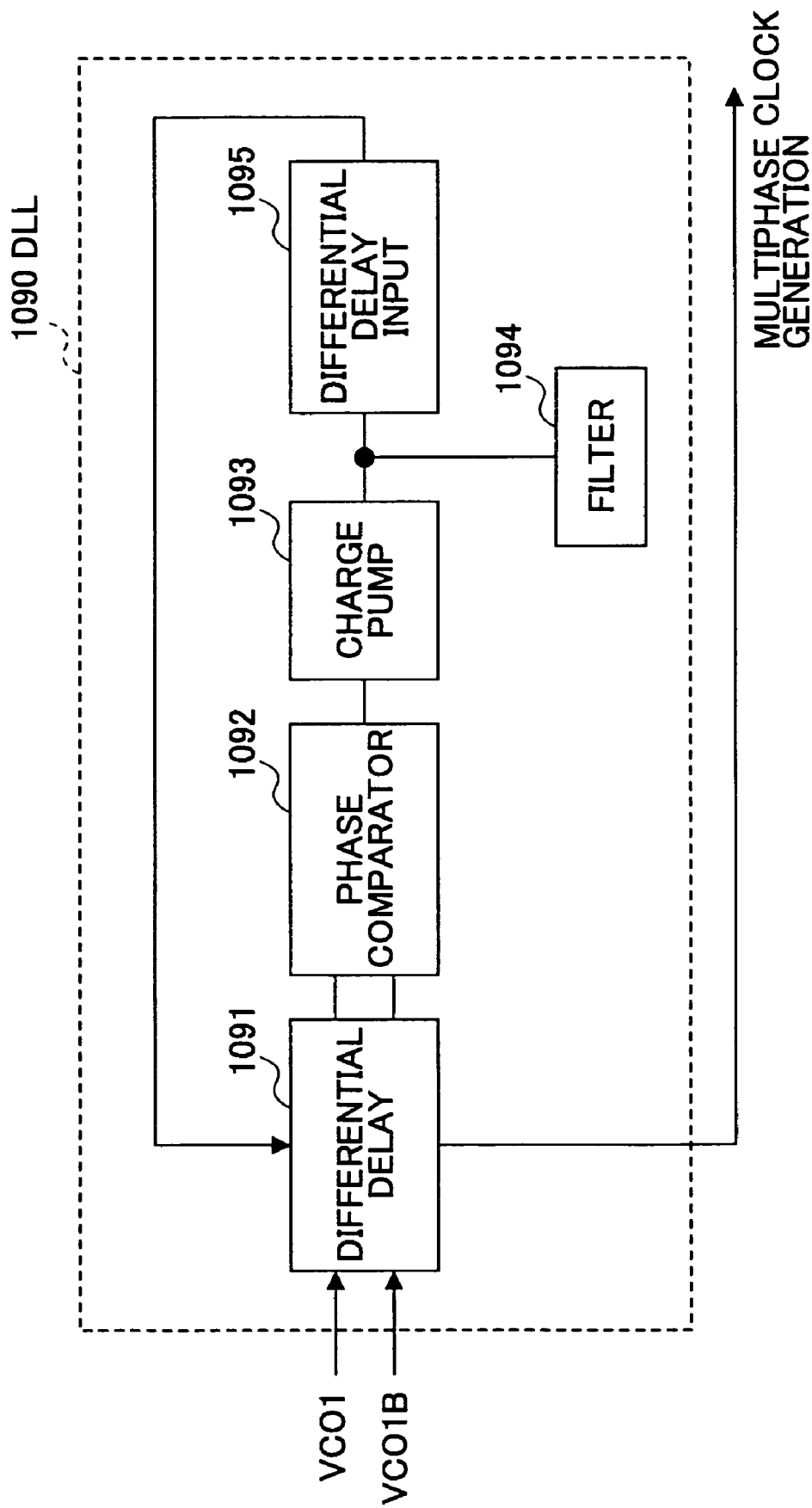
FIG. 28 illustrates a DLL unit according to another embodiment.

FIG. 28 illustrates another example in which multi-phase clocks are generated using a DLL circuit. In FIG. 28, a differential delay input unit 1095 is provided between the charge pump 1093 and the differential delay unit 1091. The differential delay input unit 1095 coarsely controls the current that flows to the differential delay unit 1091. According to the above arrangements, the gain of the differential delay unit 1091 can be reduced, and time for the DLL to lock can be reduced.

Figure 29:
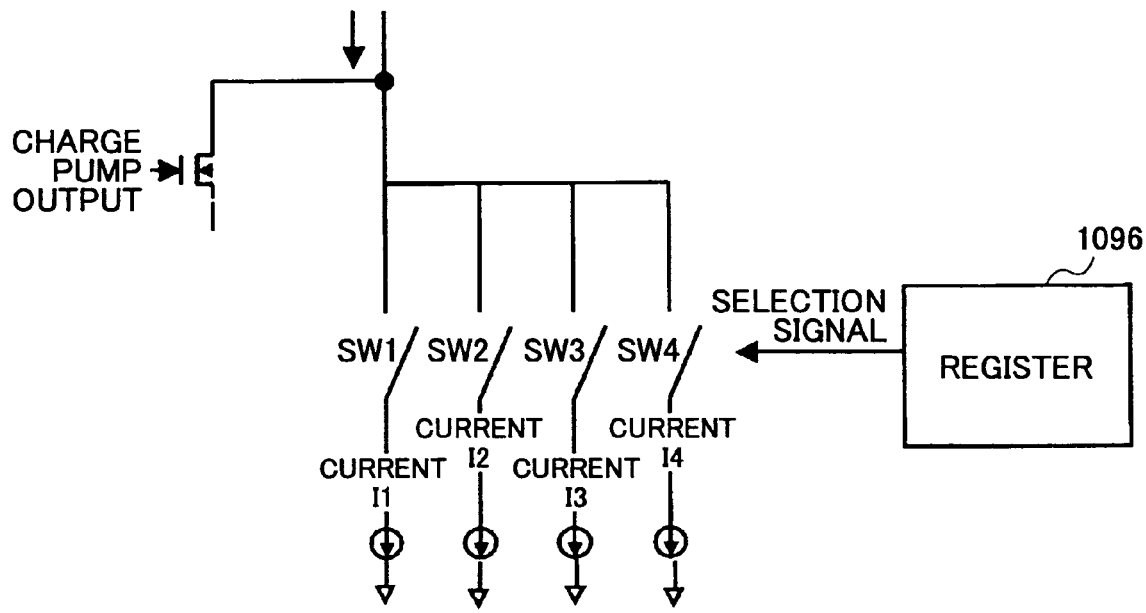
FIG. 29 illustrates an exemplary circuit of a differential delay input unit of FIG. 28.

FIG. 29 illustrates an example of the differential delay input unit 1095 according to an embodiment. Four current sources are provided in this case. The switch SW1-SW4 of each current source is turned on and off by a selection signal from a register 1096, thereby to set default current that flows through the differential delay unit 1091. Desired values are set in a register 1096. The default current and current determined as the output from the charge pump are added, and fed to the differential delay unit 1091. According to the above arrangements, a selectable range of the default current can be extended, and the gain of the differential delay unit 1091 can be reduced. In addition, time required by the DLL to lock can be reduced.

Figure 30:
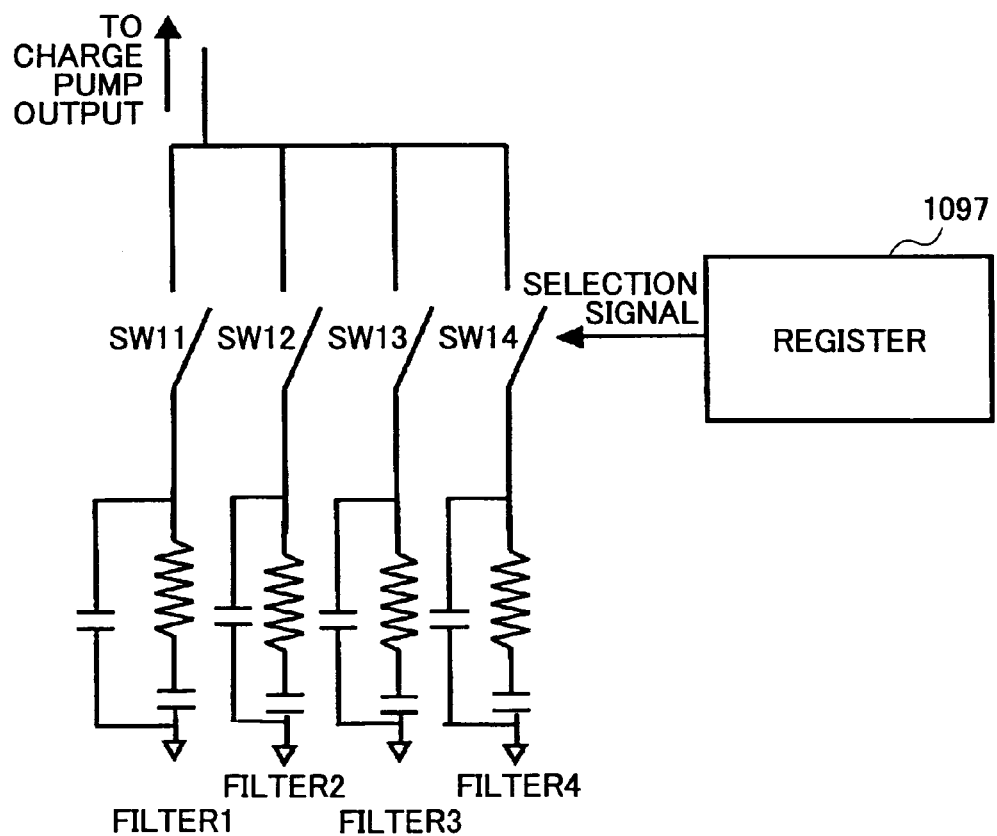
FIG. 30 illustrates an exemplary circuit of a filter unit of FIG. 28.

FIG. 30 illustrates an exemplary filter 1094 according to an embodiment. The filter 1094 shown in FIG. 30 is provided with four lag-lead filters 1-4, each switched on and off by a selection signal from the register 1097 thereby to determine the value of the filter 1094. The value of the register 1097 is also set in advance in this case. According to the above arrangements, the selectable range of the filter is extended and consequently, a suitable filter can be selected. As a result, the jitter of the clock can be reduced.

It is intended to integrate the exemplary circuits shown in FIGS. 28, 29, and 30, which results in the reduction of power consumption and size of the system.

Figure 31:
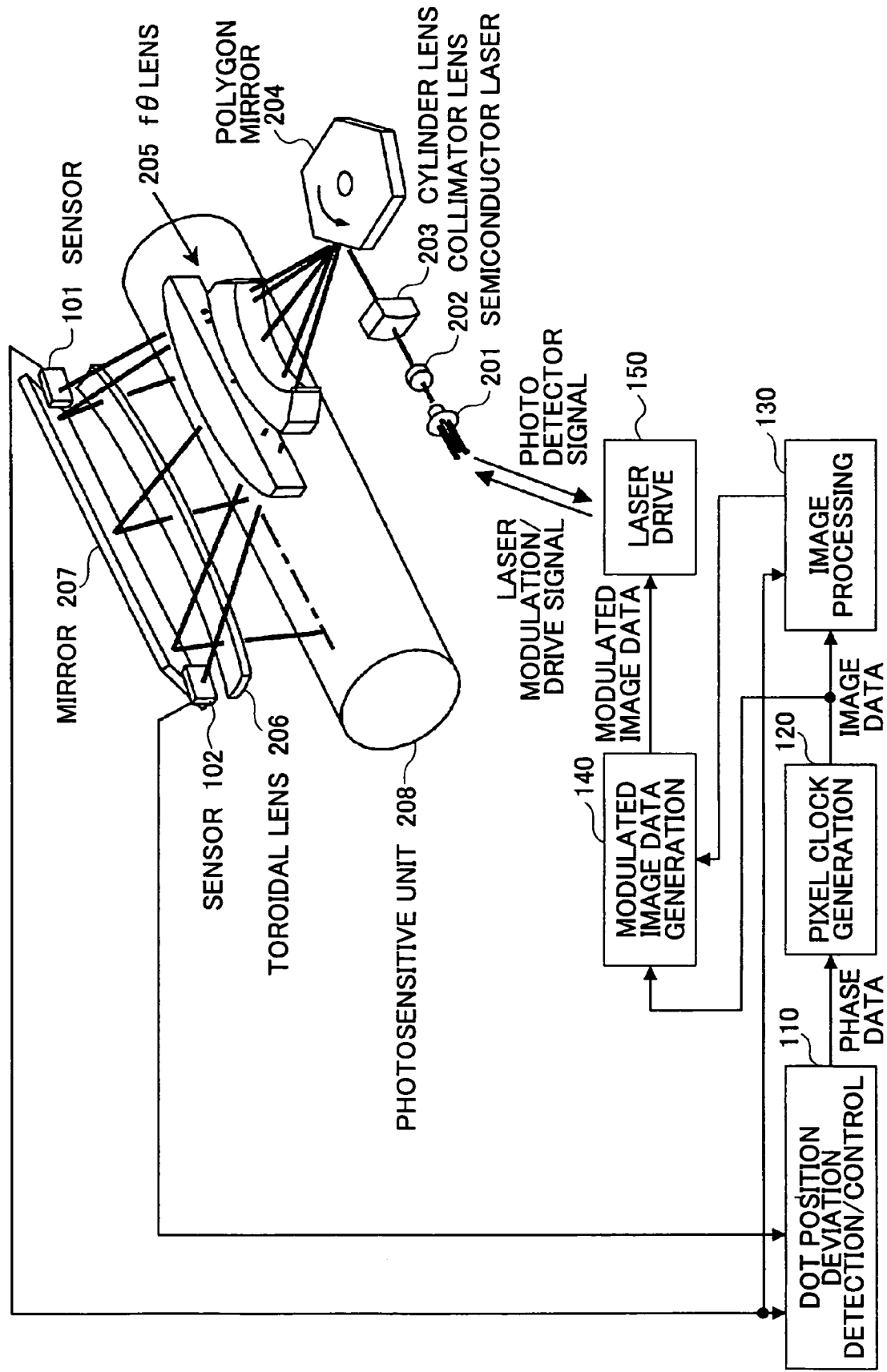
FIG. 31 illustrates an image forming apparatus according to an embodiment using a pixel clock generation circuit according to the present invention.

FIG. 31 illustrates an exemplary image forming apparatus using the pixel clock generation circuit according to the present invention. A laser beam is emitted by a semiconductor laser 201, and travels through a collimator lens 202 and a cylinder lens 203. The laser beam is scanned by a polygon mirror 204, and further travels through a fθ lens 205, a toroidal lens 206. Then, the laser beam is reflected by a mirror 208, and reaches a photosensitive unit 208. Finally, the laser beam forms an image (electrostatic latent image) on the photosensitive unit 208. Photo sensors 101 and 102 provided at the starting and ending positions of the scanning by the laser beam detects the laser beam, and feeds the detection of the laser beam to a dot position deviation/control unit 110. The dot position deviation detection/control unit 110 measures time in which the laser beam scans between the photo sensor 101 and 102, and compare the measured time with a reference time thereby to obtain deviation quantity. The dot position deviation detection/control unit 110 generates pixel clock phase data (phase data) for adjusting the deviation quantity, and outputs the data to the pixel clock generation unit 120 according to the present invention. The output signal from the photo sensor 101 is also fed to an image processing unit 130 as a line sync signal.

The dot position deviation detection/control unit 110 generates not only phase data common to each line for the same adjustment of, for example, scan inequality due to the properties of the scan lens but also phase data different line by line for different adjustment of, for example, rotation inequality of the polygon mirror. The phase data is output to the pixel clock generation unit 120 as pixel clock phase data. In the case of multi-beam scanning apparatus, multiple sets of photo sensors 101 and 102 are provided, and pixel clock phase data (phase data) for multiple lines is generated and output at the same time.

As described above, the pixel clock generation unit 120 generates modulated pixel clock, and the frequency and phase thereof are modulated based on the pixel clock phase data from the dot position deviation detection/control unit 110. The modulated pixel clock is provided to an image processing unit 130 and a modulated image data generation unit 140. The image processing unit 130 generates image data using the pixel clock as a reference, and feeds the generated image data to the modulated image data generation unit 140. The modulated image data generation unit 140 receives the image data, and generates laser drive data (modulated image data) using the pixel clock as a reference, and feeds the laser drive data to a laser drive unit 150. The laser drive unit 150 drives the semiconductor laser 201. According to the above arrangements, electrostatic latent images can be formed on the photosensitive unit 208 without involving positional deviation.

Figure 32:
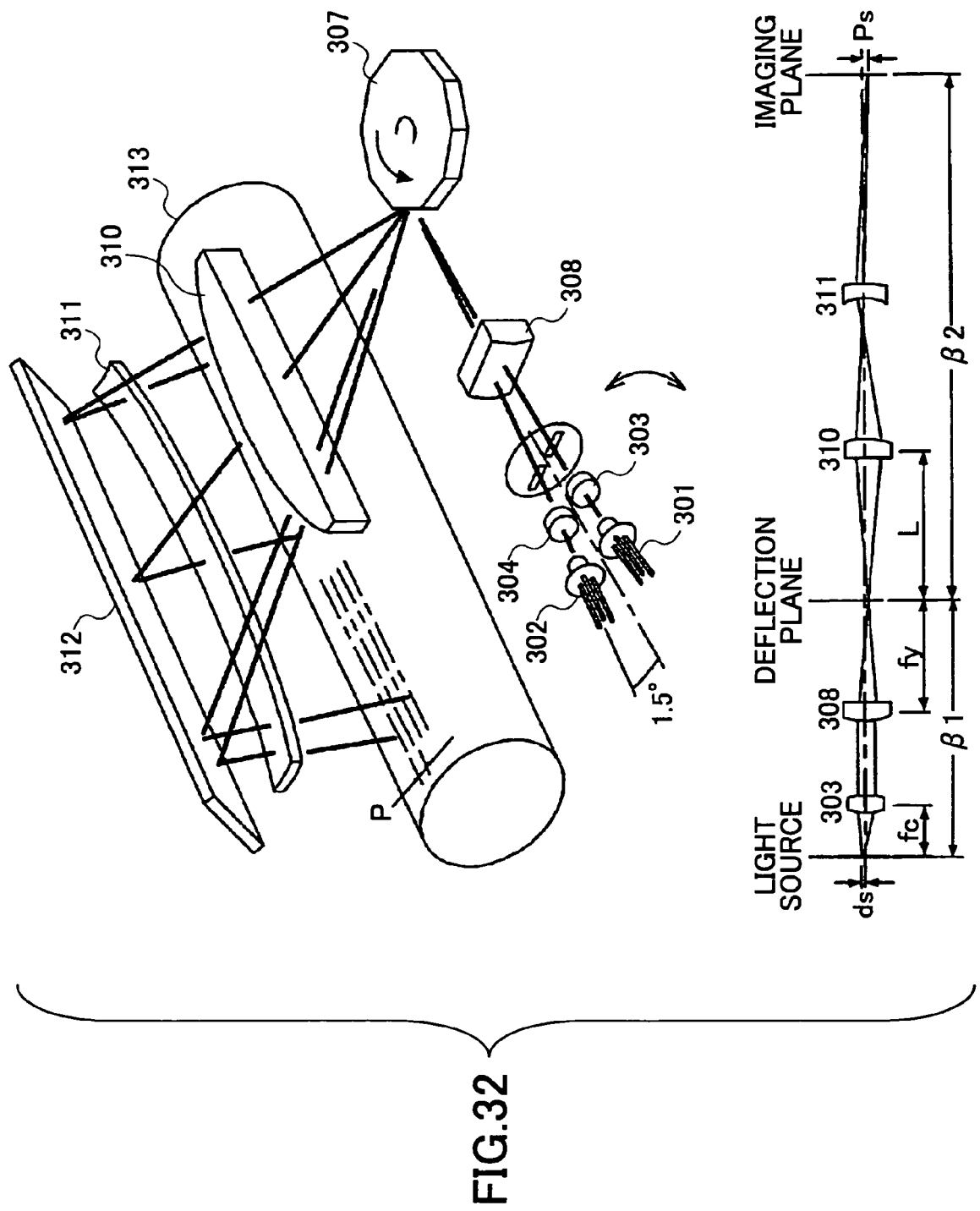
FIG. 32 illustrates a multi-beam scan apparatus used for an image forming apparatus according to the present invention.
Figure 33:
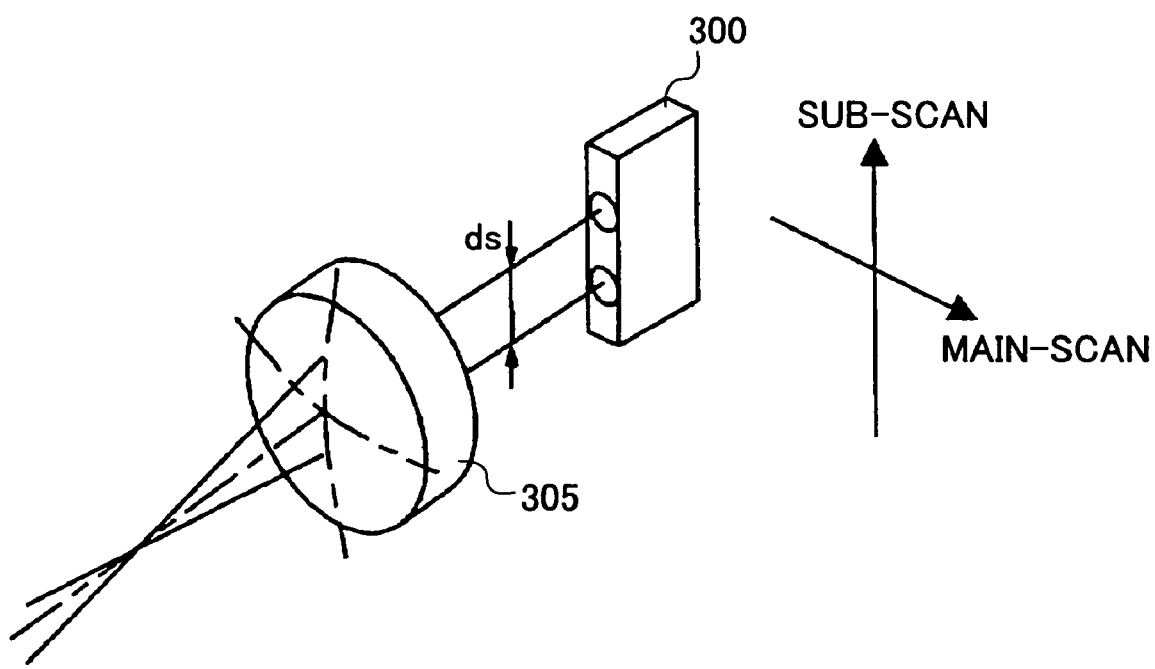
FIG. 33 illustrates 2-channel semiconductor laser array according to an embodiment.

FIG. 32 illustrates an exemplary multi-beam scanning apparatus (multi-beam optical system) according to an embodiment. According to this embodiment, two semiconductor laser arrays 300 each having two light sources disposed monolithicly with ds=25 µm distance as shown in FIG. 33 are used. The semiconductor laser arrays 300 are disposed symmetrically to the optical axis of a collimate lens 305 in the sub-scan directions.

As shown in FIG. 32, the semiconductor laser arrays 301, 302 have optical axes common to those of the collimate lenses 303, 304, respectively. The semiconductor laser arrays 301, 302 emit laser beams at emission angles symmetry in the main scan directions, and the emitted laser beams meet at the reflective point on the polygon mirror 307. Multiple laser beams emitted by each semiconductor laser array 301 or 302 travel through the cylinder lens 308, are scanned by the polygon mirror 307, and is converged on the photosensitive unit 313 by the fθ lens 310, the toroidal lens 311, and the mirror 312. The image processing unit 130 has buffer memory for storing print data for one line for each light source. The print data is read out from the buffer memory while the laser beam is scanned by a single face of the polygon mirror. Four lines are written simultaneously.

Figure 34:
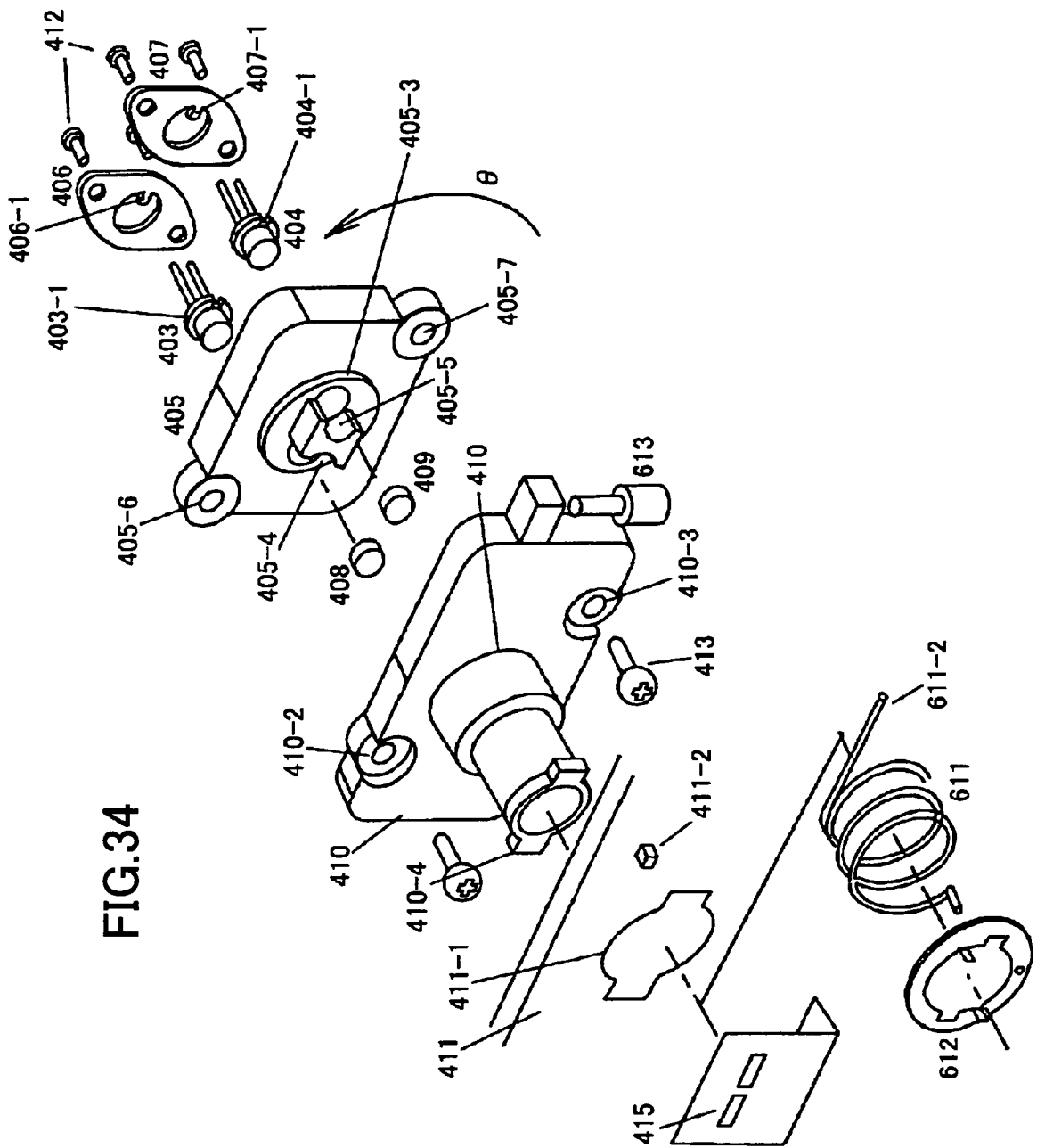
FIG. 34 is an exploded view of a light source unit of the multi-beam scan unit according to an embodiment.

FIG. 34 illustrate an exemplary light source unit of a multi-beam scan apparatus according to an embodiment. A cylindrical heat sink unit 403-1 (or 404-1) of the semiconductor laser array 403 (or 404) is fit to a hole 405-1 (or 405-2) (not shown) formed on the rear side of a base member 405, the hole 405-1 (or 405-2) being slightly slant to the main scan directions by a predetermined angle (1.5 degree in this case). The semiconductor laser array 403 (or 404) is fixed from the rear side thereof using a screw 412 with the directions in which the light sources are disposed being aligned by adjusting a protrusion 406-1 (or 407-1) of a holding member 406 (or 407). The optical axis of the collimate lens 408 (or 409) is adjusted by rotating its outer perimeter along a semicircular fixing guide surface 405-4 (or 405-5) of the base member 405. The collimate lens 408 (or 409) is aligned and adhered such that a spreading beam emitted from an emission point becomes a parallel beam.

According to the present embodiment, as described above, the laser beams from the semiconductor laser arrays meet in a main-scan plane. The fixing holt 405-1, 405-2 and the semicircular fixing guide surface 405-4, 405-5 are formed slant to the light axis.

The cylindrical fitting unit 405-3 of the base member 405 is fitted to a holder member 410, and fixed by a screw 413 to the screw hole 405-6 (or 405-7) through a through hole 410-2 (or 410-3).

Figure 36:
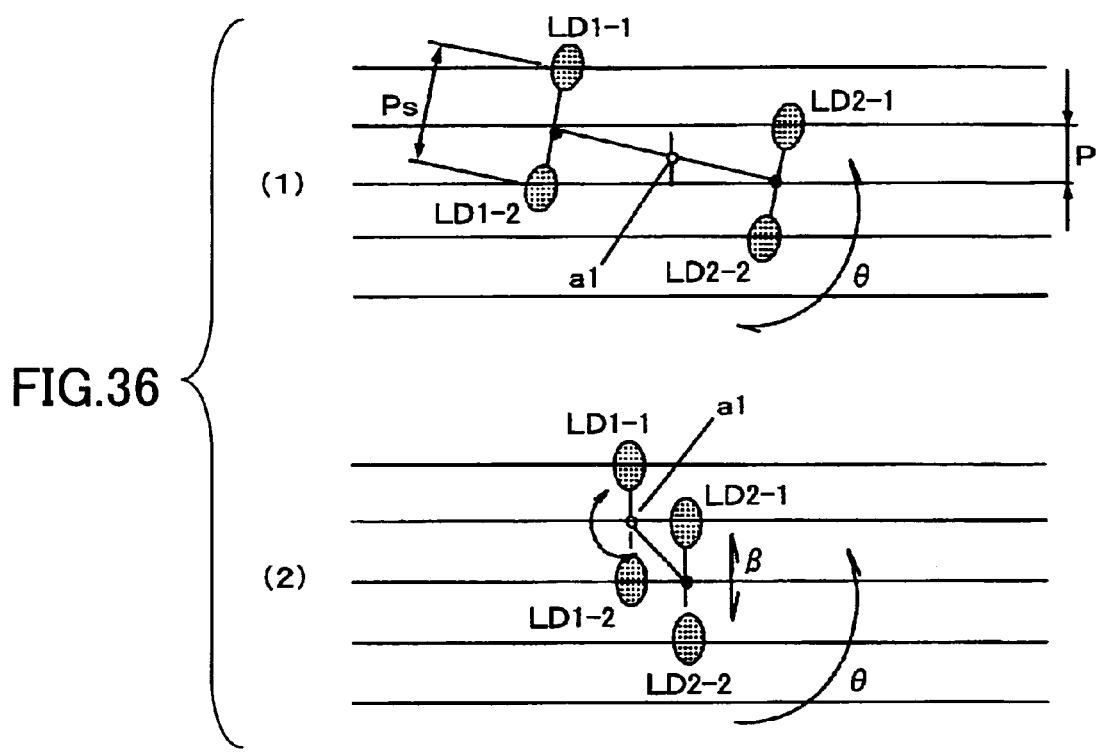
FIG. 36 illustrates the arrangements of beam spots of the light source units shown in FIGS. 34 and 35.

A cylindrical unit 410-1 of the holder member is fixed to a reference hole 411-1 provided on a fixing wall 411 of an optical housing. A spring 611 is inserted from the rear side, and a stopper member 612 is fitted to a cylindrical protrusion 410-3. The holder member 410 is closely held on the rear side of the fixing wall 411. An end of the spring 611 is caught by the protrusion 411-2 thereby to generate rotative force along the center of the cylinder as a rotative axis. The entire light source unit can be rotated along the optical axis by an angle θ by an adjustment screw 613 provided to stop the rotative force. As shown in FIG. 36 (1), each beam spot array is staggered by one line.

An aperture 415 is provided with a slit for each semiconductor laser array, and is fixed to the optical housing thereby to limit the emission diameter of the light beam.

Figure 35:
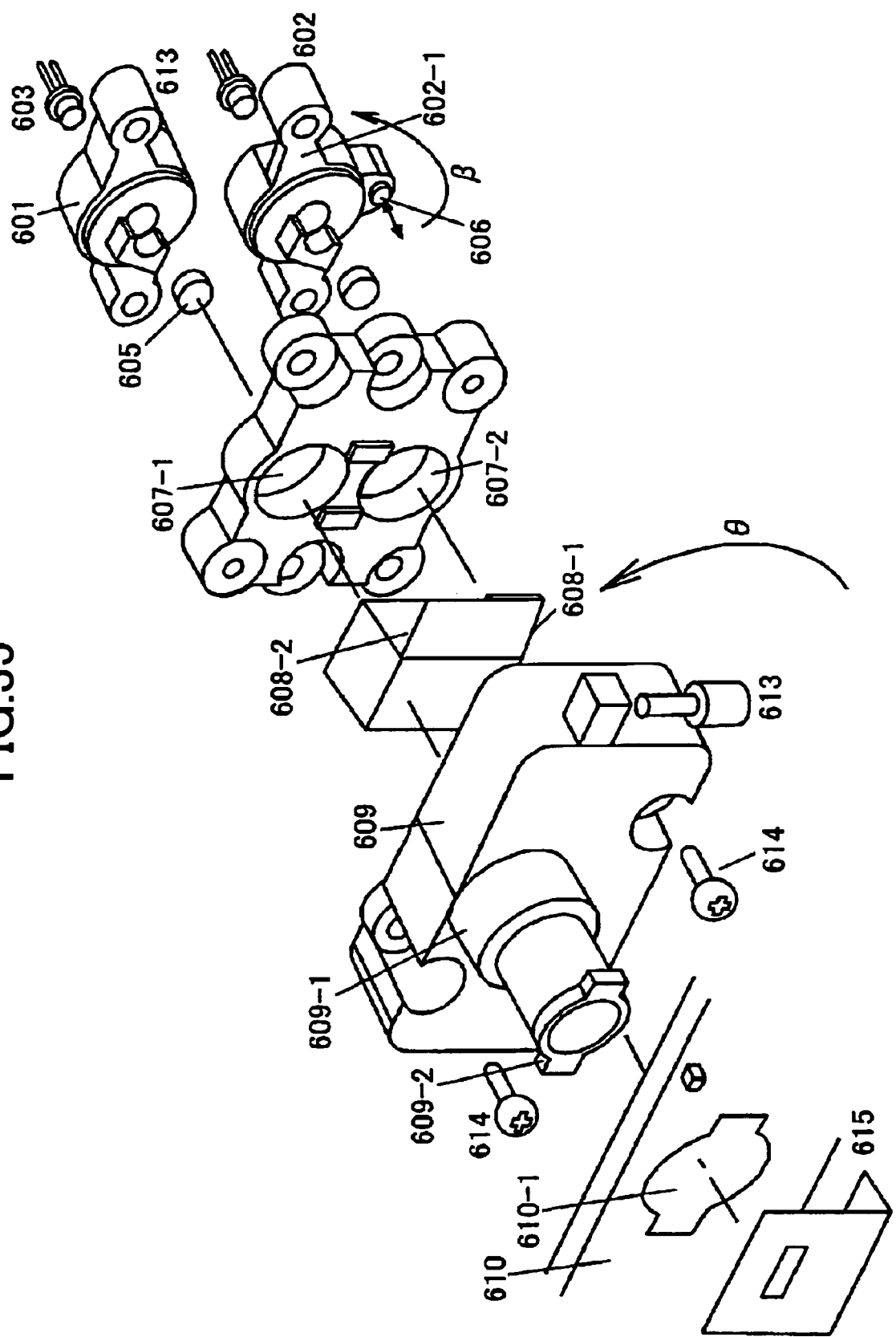
FIG. 35 is an exploded view of a light source unit according to another embodiment.

FIG. 35 illustrates another exemplary light source unit in which laser beams from two semiconductor laser arrays are combined using a beam combining unit. Each combination of a semiconductor laser array 603, 613 and a collimate lens 605, 606 is supported by a base member 601, 602, thereby to form a first light source unit and a second light source unit. The first base member 601 and the second base member 602 are fixed with screws to the same flange member 607 with the cylindrical fixing unit of the first and second base members 601 and 602 being fitted to the holds 607-1 and 607-2 provided on the flange member 607. An adjustment screw 606 is screwed to the second base member 602, and protruding portion thereof is adjusted from the rear side such that arm units 602-1 is distorted, and the supporting unit of the semiconductor array and the collimate lens is slant to the sub-scan directions β. According to the above arrangements, each beam spot array becomes staggered as shown in FIG. 36 (2).

A prism 608 has a parallelogram cylinder portion and a triangle cylinder portion. The prism 608 reflects each beam from the second light source with a slope 608-1, and shifts the reflected beam close to each beam from the first light source reflected and output by a beam splitter face 608-2. The closely-shifted multiple beams are scanned by the polygon mirror at a time, and converged on the photosensitive unit thereby to form beam spots. An aperture 615 is supported by an optical housing in the similar manner. Since the light beams from the semiconductor laser arrays almost overlap, a common slit 615 is provided. A flange member 607 is supported by a holder member 609. The cylinder portion 609-1 of the holder member is fixed to a reference hold 610-1 provided to a fixing wall 610 in the same manner as the above embodiment. The angle of each beam spot array can be adjusted by rotating the entire unit.

Figure 37:
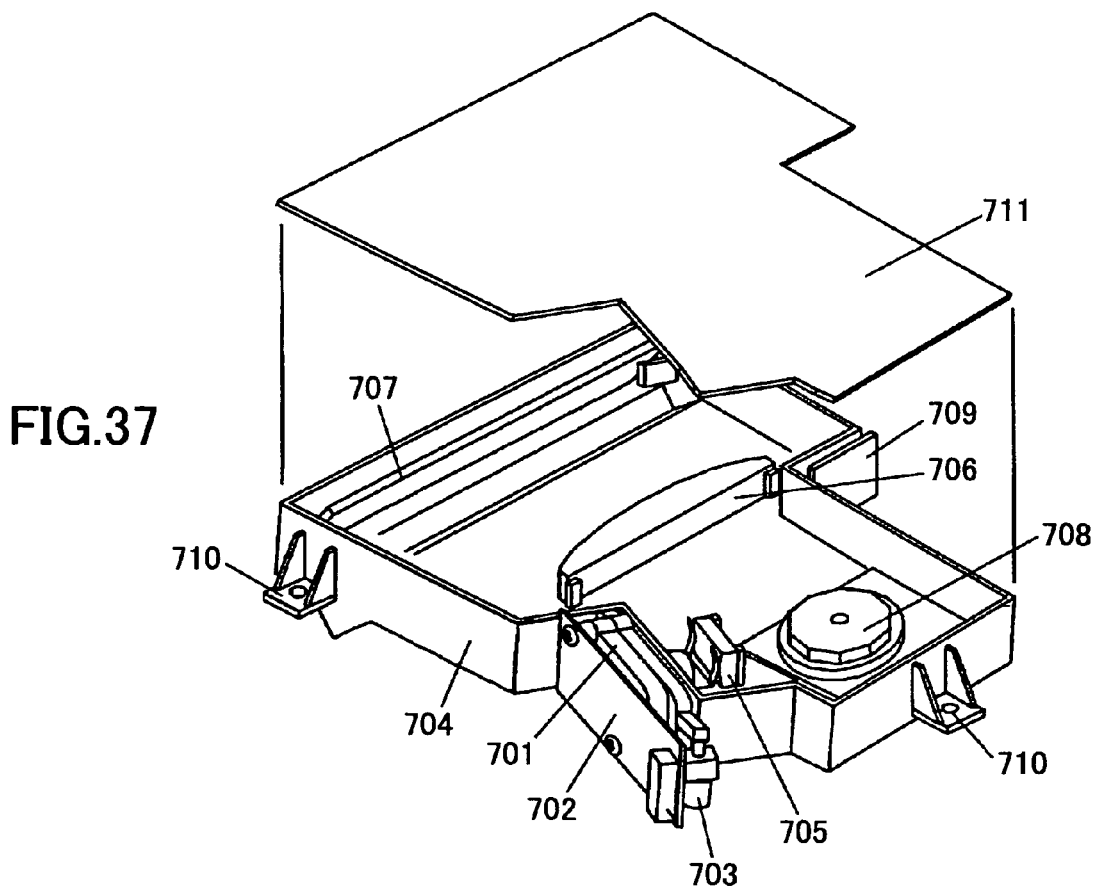
FIG. 37 is an elevational view of the multi-beam scan unit disposed in an optical housing according to an embodiment.

FIG. 37 illustrates an exemplary multi-beam scan apparatus configured by mounting the light source unit (701) shown in FIG. 34 on an optical housing. A print board 702 on which a drive circuit that control the semiconductor laser is mounted on the rear face of the light source unit 701. The print board 702 contacts to the wall face of the optical housing 704 perpendicular to the light axis using a spring 611 described above, and the print board 702 is aligned by an adjustment screw 703. The adjustment screw 703 is screwed to a protrusion formed on the housing wall face. A cylinder lens 705, a polygon motor 708 for rotating a polygon mirror, a fθ lens 706, a toroidal lens, and a returning mirror 707 are disposed at predetermined positions in the optical housing. A print board 709 on which a sync detection sensor is mounted is fixed from the outside to the housing wall face in the same manner as the light source unit. The optical housing 704 is shielded with a cover 711 from the top, and fixed to the flame member of an image forming apparatus body using screws to multiple fixing units 710 protruding from the wall face.

Figure 38:
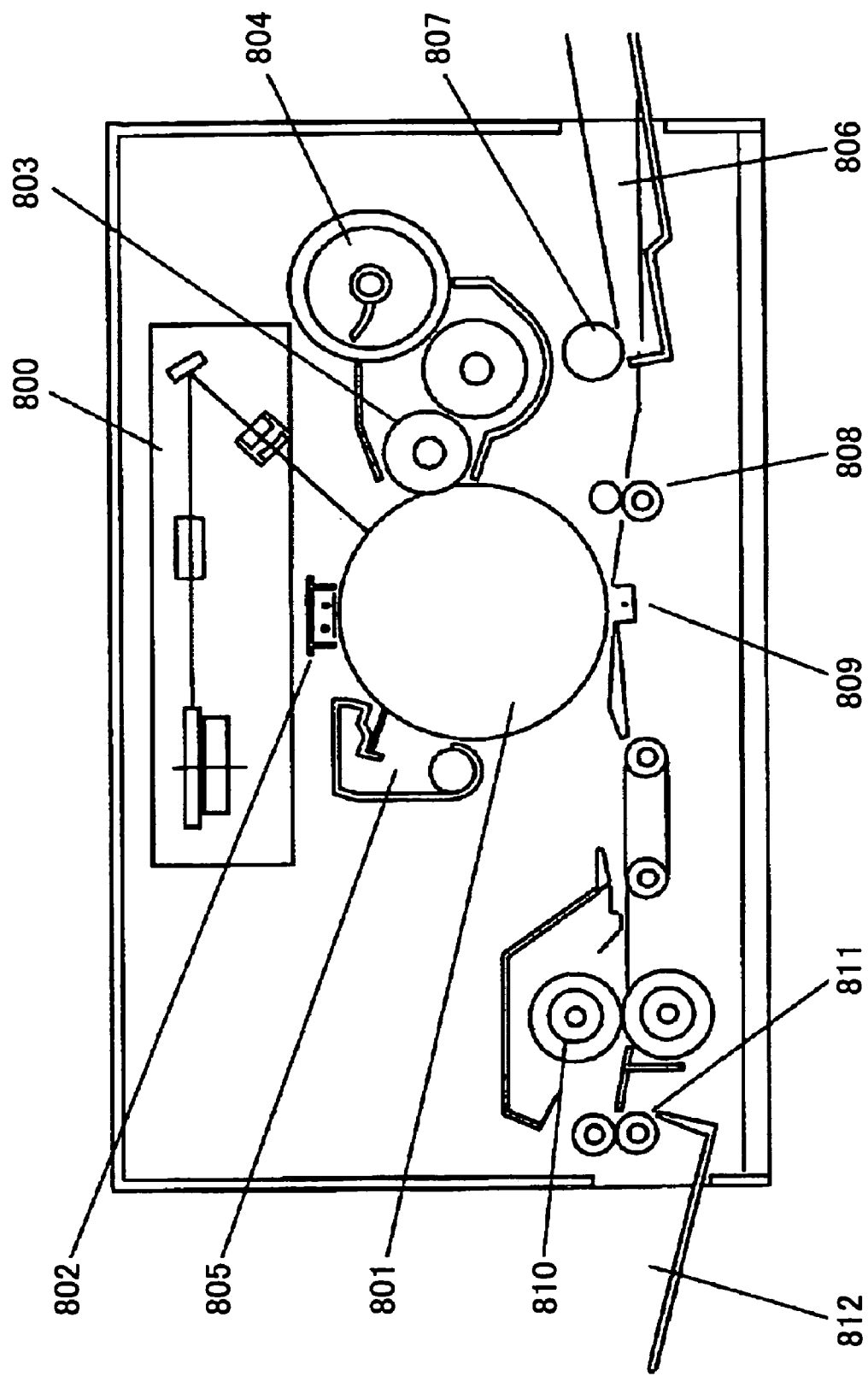
FIG. 38 is a cross-sectional view of an image forming apparatus having a light scan unit according to an embodiment.

FIG. 38 is a cross-sectional view showing the internal structure of an image forming apparatus in which the above optical scan apparatus is mounted. The following units are provided around a photosensitive dram 801 which is canned: a charger 802 for charging a photosensitive unit at high voltage, a development roller 803 that develops an electrostatic latent image formed by the optical scan apparatus 800, a toner cartridge that supply toner to the development roller 803, and a cleaning case 805 that cleans and stores toner remaining on the dram 801. As described above, multiple lines of the latent image are written on the photosensitive drum 801. Paper is fed from a paper feed tray 806 by a paper feed roller 807, and sent by a resist roller pair 808 in synchronization with timing in which recording in the sub-scan directions starts. A toner image is transferred to the paper when it pass around the photosensitive drum 801 by a transfer charger 809, and fixed by a fixing roller 810. The paper is discharged to a paper tray 812 by a paper discharge roller 811.

Figure 39:
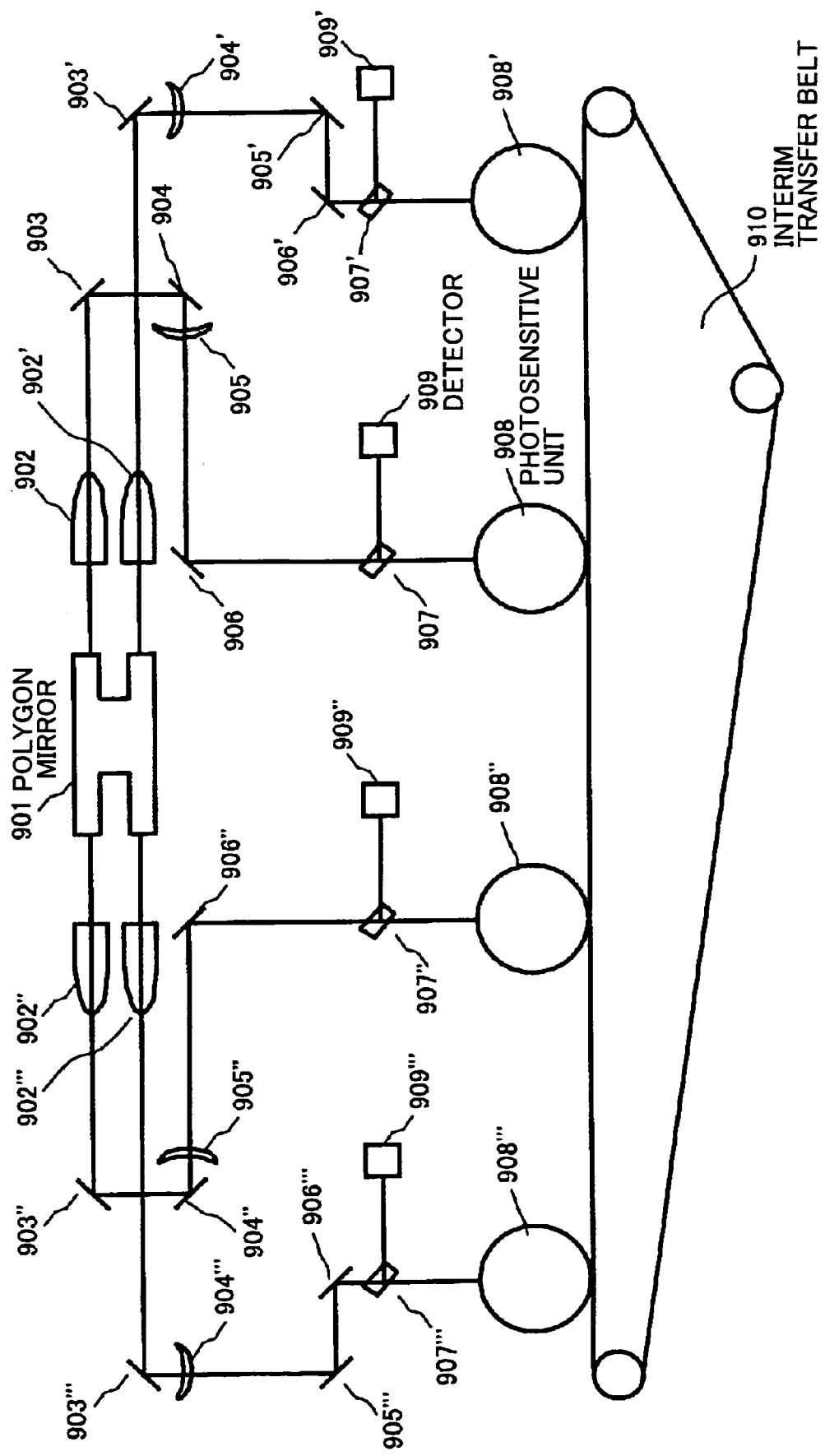
FIG. 39 illustrates the main portion of a tandem color apparatus according to an embodiment.
Figure 40:
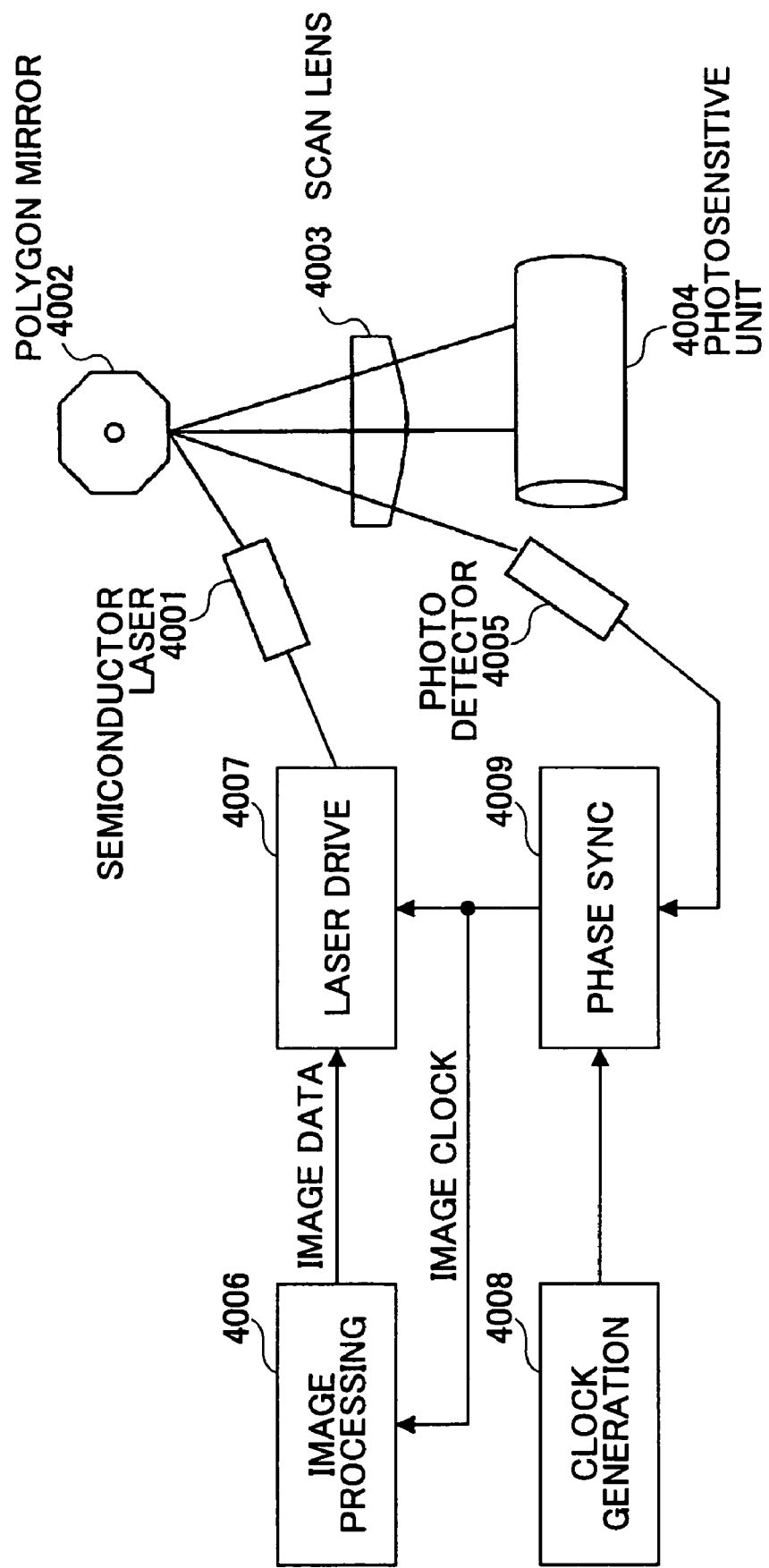
FIG. 40 illustrates a conventional image forming apparatus.

FIG. 39 illustrates a tandem color image forming apparatus that supports multi-color printing having multiple photosensitive units in which the optical scan apparatus and the image forming apparatus according to the above embodiments are applied. FIG. 39 is a cross-sectional view showing portions relevant to the present invention. In FIG. 39, 901 denotes a polygon mirror, 902 denotes a scan lens 1, 903 and 904 denote returning mirrors, 905 denotes a scan lens 2, 906 denotes a returning lens, 907 denotes a semitransparent member, 908 denotes a photosensitive unit, 909 denotes a detector; and 910 denotes an intermediate transfer belt.

As shown in FIG. 39, four photosensitive units 908 and four scan optical systems are provided around the polygon mirror 901 which is dual-staged. In this case, the beam is guided to the detector by mirrors disposed at both end of the effective scan line. In addition, a measurement pattern image is formed on the intermediate transfer belt 910 for measuring the dot position of each color using the sensors provided for each scan optical system. By performing the adjustment described above, the dot position of each color can be accurately adjusted even if the dot position changes over time.

The tandem color image forming apparatus needs different photosensitive units corresponding to multiple colors such as cyan, magenta, yellow, and black. The scan optical units form a latent image via different optical paths on respective photosensitive units. As a result, main-scan dot position deviation occurs on each photosensitive unit may have different characteristics. The optical scan apparatus as described above allows the tandem color image forming apparatus to form high quality images, the main-scan dot position deviation is preferably adjusted. Particularly, the tandem color image forming apparatus can reproduce color reducing color deviation between stations.

In the case in which there is color deviation between the stations of about 10 μm, if the main-scan position deviation exceeds ⅛ dots, the adjustment of the main-scan position deviation can be performed by shifting the phase. In the case of 1200 dpi, the dot position can be reduced to about 2.6 μm (21.2 μm/8) corresponding to ⅛ dots.

The preferred embodiments of the present invention are described above. The present invention is not limited to these embodiments, but variations and modifications may be made without departing from the scope of the present invention.

This patent application is based on Japanese priority patent application No. 2004-117200 filed on Apr. 12, 2004, the entire contents of which are hereby incorporated by reference.

What is claimed is:

1. A pixel clock generation circuit, comprising:
a high frequency clock generation unit configured to generate a high frequency clock;
a clock modulation data generation unit configured to generate clock modulation data based on pixel clock phase data indicating timing of a transition in the pixel clock;
a modulation clock generation unit, including a shift register, configured to load the clock modulation data to the shift register in response to a load signal, to shift the clock modulation data based on the high frequency clock outputted from the high frequency clock generation unit, and to modulate the phase of the pixel clock based on a high frequency clock and the shifted clock modulation data to generate a modulated pixel clock; and
a phase adjustment unit that adjusts the phase of an output from each shift register of the pixel clock generation circuit; the phase adjustment unit comprising M×N registers (N columns), and where the output from each shift register is latched to each register for a first stage based on high frequency clocks the phase of which is the same, and then shifted using high frequency clocks the phase of which is different from each other.

2. The pixel clock generation circuit as claimed in claim 1, wherein said clock modulation data generation unit comprises:
a clock modulation data output unit configured to output clock modulation data including a plurality of bits that are consecutive 1's in a first portion of the output clock modulation data and consecutive 1's in the remaining portion of the output clock modulation data, or consecutive 0's in a first portion of the output clock modulation data and consecutive 1's in the remaining portion of the output clock modulation data, the number of the 1's and/or the number of 0's being variable, based on the pixel clock phase data; and a load signal output unit configured to output a load signal for loading the clock modulation data into said modulation clock generation unit based on the pixel clock phase data.

3. The pixel clock generation circuit as claimed in claim 2, wherein
the modulated pixel clock is generated, the frequency and phase of which are modulated by serially shifting the loaded clock modulation data based on the high frequency clock.

4. The pixel clock generation circuit as claimed in claim 3, wherein
the shift register comprises a plurality of rows (M rows);
the pixel clock generation circuit further comprises a multiplexer configured to sequentially select an output from the shift register of each row;
the clock modulation data having a plurality of bits P1, P2, ..., PM, PM+1, ... is divided into M groups including data of every M bits [P1, PM+1, P2M+1, ... ], [P2, PM+2, P2M+2, ... ], ..., [PM, P2M, P3M, ... ];
the divided M groups of data are loaded to the shift register of M rows;
each shift register is shifted using M-phase high frequency clocks the phase of which is different from each other; and
the output of each shift register is sequentially selected by the multiplexer in synchronization with the M-phase high frequency clocks thereby to generate modulated pixel clock.

5. The pixel clock generation circuit as claimed in claim 3, wherein
the shift register comprises a plurality of rows (M rows);
the pixel clock generation circuit further comprises a multiplexer configured to sequentially select an output from the shift register of each row;
the clock modulation data having a plurality of bits P1, P2, ..., PM, PM+1, ... is divided into M groups including data of every M bits [P1, PM+1, P2M+1, ... ], [P2, PM2, P2M2, ... ], ..., [PM, P2M, P3M, ... ];
the divided M groups of data are loaded to the shift register of M rows;
each shift register is shifted using a high frequency clocks the phase of which is the same;
the output of each shift register is adjusted by the phase adjustment unit based on M-phase high frequency clocks;
the output corresponding to each shift register, the phase of the output being adjusted by the multiplexer is sequentially selected in synchronization with the M-phase high frequency clocks thereby to generate modulated pixel clock.

6. The pixel clock generation circuit as claimed in claim 2, wherein the clock modulation data generation unit comprises:
a conversion data generation unit configured to generate conversion data for the load signal based on the pixel clock phase data; and
a load signal output unit configured to receive the high frequency clock and, when the number of cycles of the received high frequency clock reaches the conversion data, output the load signal.

7. The pixel clock generation circuit as claimed in claim 1, wherein the high frequency clock generation unit comprises a PLL circuit having a differential ring oscillator.

8. The pixel clock generation circuit as claimed in claim 7, wherein the high frequency clock generation unit generates multi-phase clocks the phase of which is different from each other by outputting clock signal having different phase generated in the differential ring oscillator.

9. The pixel clock generation circuit as claimed in claim 1, wherein
the high frequency clock generation unit comprises a delay unit configured to delay a basic clock, and generates multi-phase clocks the phase of which is different from each other.

10. The pixel clock generation circuit as claimed in claim 9, wherein
the high frequency clock generation unit further comprises a delay quantity control unit configured to control the delay quantity of the delay unit.

11. The pixel clock generation circuit as claimed in claim 10, wherein
the delay quantity control unit comprises a phase difference detection unit configured to detect the delay quantity of the clocks, and an error amp unit.

12. The pixel clock generation circuit as claimed in claim 1, wherein
the high frequency clock generation unit comprises a DLL circuit comprising a differential delay unit, a phase comparator unit, a charge pump unit, a filter unit; and
a plurality of high frequency clocks having the same frequency and different phase are output from the differential delay unit.

13. The pixel clock generation circuit as claimed in claim 12, wherein
the DLL circuit further comprises an initial value setting unit configured to set a control current at an initial value, the control current controlling the delay quantity of the differential delay unit.

14. The pixel clock generation circuit as claimed in claim 12, wherein
the filter unit comprises a plurality of filters; and
the DLL circuit further comprises an initial value setting unit configured to set a control current at an initial value upon initialization.

15. An image forming apparatus, comprising:
a light source unit configured to emit a light beam;
a photosensitive unit the surface on which a latent image is formed;
a deflection unit configured to deflect the light beam emitted by the light source thereby to scan the surface of the photosensitive unit and form the latent image; and
the pixel clock generation circuit as claimed in claim 1.

16. The image forming apparatus as claimed in claim 15, wherein the image forming apparatus further comprises a plurality of light sources each configured to emit a light beam for scanning the surface of the photosensitive unit.

17. The image forming apparatus as claimed in claim 15, wherein the image forming apparatus is a tandem color image forming apparatus having a plurality of photosensitive units.

* * * * *